(12) United States Patent
Takagi et al.

(10) Patent No.: US 6,356,096 B2
(45) Date of Patent: Mar. 12, 2002

(54) TEST BOARD FOR TESTING A SEMICONDUCTOR DEVICE UTILIZING FIRST AND SECOND DELAY ELEMENTS IN A SIGNAL-TRANSMISSION-PATH

(75) Inventors: Ryoichi Takagi; Masahiro Ueda; Yoshinori Deguchi, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/146,173

(22) Filed: Sep. 3, 1998

(30) Foreign Application Priority Data

May 7, 1998 (JP) .......................................... 10-124712

(51) Int. Cl.[7] .............................................. G01R 31/26
(52) U.S. Cl. ..................................................... 324/765
(58) Field of Search ................................ 324/765, 617; 714/700, 745

(56) References Cited

U.S. PATENT DOCUMENTS

| | | | |
|---|---|---|---|
| 4,497,056 A | * 1/1985 | Sugamori | ................... 714/736 |
| 4,827,437 A | 5/1989 | Blanton | ................. 364/571.01 |
| 5,623,805 A | 4/1997 | Morello | ..................... 52/749.1 |
| 5,675,265 A | * 10/1997 | Yamamori | ..................... 327/3 |
| 6,092,030 A | * 6/2000 | Lepejian et al. | ............... 702/79 |

* cited by examiner

*Primary Examiner*—Ernest Karlsen
*Assistant Examiner*—Russell M. Kobert
(74) *Attorney, Agent, or Firm*—Oblon, Spivak, McClelland, Maier & Neustadt, P.C.

(57) ABSTRACT

A test board for testing a semiconductor device. The semiconductor device includes at least first and second input terminals and an input/output buffer cell for buffering a signal obtained from the first input terminal to output an internal signal. The operation of the semiconductor device is controlled by a signal obtained from the second input terminal. The test board includes a first delay element for delaying a signal to be transmitted therethrough for a first signal propagation delay time and a second delay element for delaying a signal to be transmitted therethrough for a second signal propagation delay time different from the first signal propagation delay time. A signal-transmission-path receives a first test signal and forms, a first signal transmission path along which the first test signal is transmitted through the first delay element to the first input terminal of the semiconductor device, and a second transmission path along which the first test signal is transmitted through the second delay element to the second input terminal of the semiconductor device.

8 Claims, 17 Drawing Sheets

TEST BOARD FOR TESTING A SEMICONDUCTOR DEVICE UTILIZING FIRST AND SECOND DELAY ELEMENTS IN A SIGNAL-TRANSMISSION-PATH

BACKGROUND OF THE INVENTION

1. Field of the Invention

The present invention relates to a circuit structure of an internal input/output (I/O) buffer achieving a high-precision timing verification test of a semiconductor device (hereinafter referred to as an "LSI").

2. Description of the Background Art

FIG. 23 shows a structure of a conventional LSI with a semiconductor test device (hereinafter referred to as a "LSI tester") in the test state.

An LSI tester 500 is composed of a tester body 504 and a test head 506. The tester body 504 includes a timing generator 501 generating a timing signal necessary as a condition of the LSI test, a waveform formatter 502 determining a waveform of rising or falling timing, and a power-supply/DC measuring unit 503 having a power supply for driving a device, a measuring portion for the DC of the device, and the like. The test head 506 makes direct transmissions of a signal to/from an LSI to be test 505 on the basis of a control signal obtained from the test body 504 through a cable 507.

In testing the LSI to be test 505, a pin electronic tester driver 509 stored in the test head 506 generates a test signal that is applied through a POGO pin 510, a wire 512 of a DUT board 511, an electrode 514 of a socket 513, and a wire 516 of an LSI package 515 to the LSI to be test 505. Conversely, after the operation of the LSI 505, a reaction signal is transmitted along the same path to a tester comparator 517 in the LSI tester 500, in which that signal is compared with an expected value EXP, by which the LSI tester 500 judges whether the LSI 505 operates as designed or not.

In testing the LSI 505 by the LSI tester 500 as described above, one of test items, the timing verification test, has caused a problem as described below. As the LSI 505 increases its operating speed, an interface thereof requires a clock speed of several hundreds MHz, which considerably reduces the value of setup or hold timing that is a product spec of the LSI 505. This makes it difficult for the LSI tester 500 to perform a high-precision timing verification test with rigid timing conditions.

To give a concrete example, we refer to FIGS. 24 and 25 that show a structure of a conventional I/O buffer cell 520, and a timing relation between a data terminal 521 and a clock terminal 522 in the timing verification test, respectively.

As shown in FIG. 24, a clock CLK obtained from the clock terminal 522 is applied through a clock input portion 611 to respective control inputs of a driver 524 and a receiver 525. The operation of the driver 524 and the receiver 525 is controlled by the clock CLK.

Further, data DATA obtained from the data terminal 521 is applied through a data input/output portion 612 to one input of the receiver 525, and a reference voltage VREF is applied through a reference-voltage input portion 607 to the other input of the receiver 25. The receiver 525 compares the data DATA and the reference voltage VREF, and according to the comparison result, outputs an internal signal obtained through buffering, via a signal output portion 610 to an internal logic 523.

The output of the internal logic 523 is applied through a signal input portion 609 to an input of the driver 524, the output of which is applied through the data input/output portion 612 to the data terminal 521.

If a product standard of the setup time of the data DATA relative to the clock CLK 5 of the I/O buffer cell 520 provided in the LSI to be test 505 is 0.2 ns, for example, consider the case where the LSI tester 500 performs the timing verification test of whether the I/O buffer cell 520 in the LSI to be test 505 satisfies the timing condition that the setup time be 0.2 ns.

Even in the timing verification test with a setup time TS1 in FIG. 25 where L1 depicts a waveform for the data DATA and L3 a waveform for the clock CLK, the skew α occurs in actual practice to both of the data DATA and the clock CLK. If the data DATA gains phase lead as depicted by a waveform L2 and the clock CLK gains phase lag as depicted by a waveform L4, the timing verification test will be performed with a setup time ts2 which is considerably longer than the original setup time TS1.

To be concrete, assuming that signal propagation time variations due to the timing skew of the signals caused by the LSI tester 500 are ±0.15 ns, those due to the lengths of the wire 512 of the DUT board 511 and the electrode 413 of the socket 513 are ±0.05 ns, and those due to the length of the wire 516 of the package 515 are ±0.1 ns, a phase difference between the clock CLK and the data DATA reaches 0.6 ns maximum.

Thus, when the clock CLK gains phase lag of 0.6 ns with respect to the data DATA, in order to surely ensure the setup time of 0.2 ns, a test program value tp is required to be set at −0.4 ns (so as to advance the clock CLK 0.4 ns faster than the data DATA). The reason for setting the value at −0.4 ns is as follows: If the test program value tp is set larger than −0.4 ns, when the clock CLK gains phase lag of 0.6 ns with respect to the data DATA, the timing verification test will be performed with the setup time of (tp+0.6) ns which is larger than 0.2 ns. This incurs the risk that the LSI to be test 505 may be wrongly judged as acceptable even if failing to satisfy the setup time of 0.2 ns.

The timing skew in the LSI tester 500, however, still remains even though the test program value tp is set at −0.4 ns. Thus, when timing of the actual application of the signals to the LSI 505 is the worst (the data DATA gains a phase lag of 0.6 ns with respect to the clock CLK), the timing skew of −1.0 ns may occur.

When the timing of the application is the worst as described above, most of acceptable LSIs to be test 505 will be judged as defective, which causes extreme reduction in yield of the LSI 505.

SUMMARY OF THE INVENTION

A first aspect of the present invention is directed to a semiconductor device comprising a first input/output buffer cell receiving first and second input signals and a first test-mode signal and buffering the first input signal to output an internal signal. The first input/output buffer cell comprises: delay means for receiving the first input signal and delaying the first input signal for a predetermined delay time to output a first delay input signal; first input-signal selecting means for outputting either of the first delay input signal and the second input signal as a first selection signal on the basis of the first test-mode signal; and internal-signal output means for buffering the first input signal to output the internal signal, the operation of the internal-signal output means controlled by the first selection signal.

Preferably, according to a second aspect of the present invention, the semiconductor device of the first aspect further comprises: a second input/output buffer cell for buffering the internal signal to output an output signal to the outside. The operation of the second input/output buffer cell is controlled by the second input signal.

Preferably, according to a third aspect of the present invention, the semiconductor device of the second aspect further comprises: an internal-signal processing circuit for processing the internal signal in a predetermined way to output a processed signal; and signal control means for receiving a second test-mode signal and controlling the validity or invalidity of outputting the processed signal to the first and the second input/output buffer cells on the basis of the second test-mode signal.

Preferably, according to a fourth aspect of the present invention, the semiconductor device of the first aspect further comprises: an internal-signal processing circuit for processing the internal signal in a predetermined way to output a processed signal; second input-signal selecting means for receiving a second test-mode signal and outputting either of the processed signal and the internal signal as a second selection signal on the basis of the second test-mode signal; and a second input/output buffer cell for buffering the second selection signal to output an output signal to the outside. The operation of the second input/output buffer cell is controlled by the second input signal.

Preferably, according to a fifth aspect of the present invention, in the semiconductor device of the first aspect, the delay means comprises: an inverter chain comprising a plurality of series-connected inverters with its first-stage inverter receiving the first input signal at its input; inverter delay-time control means for controlling respective signal propagation delay times of the plurality of inverters; and a selector for selectively outputting a signal related to one of the outputs of the plurality of inverters as the first delay input signal.

Preferably, according to a sixth aspect, in the semiconductor device of the fifth aspect, the plurality of inverters includes an odd number, not less than three, of inverters in loop connection with the output of its last-stage inverter connected to the input of its first-stage inverter. The inverter delay-time control means includes: signal comparison means for comparing the number of reference oscillations and the number of oscillations of an oscillating signal obtained by oscillating the odd number of inverters in loop connection during a predetermined period of time, to output its comparison result; and control-signal output means for determining the signal propagation delay time on the basis of the comparison result, and applying a control signal indicating the signal propagation delay time to the plurality of inverters.

Preferably, according to a seventh aspect of the present invention, in the semiconductor device of the sixth aspect, a total signal propagation delay time of the plurality of inverters is set to be the same as a cycle of the first input signal.

An eighth aspect of the present invention is directed to a test board for testing a semiconductor device. The semiconductor device includes at least first and second input terminals and an input/output buffer cell for buffering a signal obtained from the first input terminal to output an internal signal. The operation of the semiconductor device is controlled by a signal obtained from the second input terminal. The test board comprises: first delay means for delaying a signal to be transmitted therethrough for a first signal propagation delay time; second delay means for delaying a signal to be transmitted therethrough for a second signal propagation delay time different from the first signal propagation delay time; and signal-transmission-path forming means for receiving a first test signal and forming, in a first test mode, a first signal transmission path along which the first test signal is transmitted through the first delay means to the first input terminal of the semiconductor device, and a second transmission path along which the first test signal is transmitted through the second delay means to the second input terminal of the semiconductor device.

Preferably, according to a ninth aspect of the present invention, in the test board of the eighth aspect, the second signal propagation delay time is set longer than the first signal propagation delay time. The test board further comprises: third delay means for delaying a signal to be transmitted therethrough for a third signal propagation delay time; and fourth delay means for delaying a signal to be transmitted therethrough for a fourth signal propagation delay time shorter than the third signal propagation delay time. Further, in a second test mode, the signal-transmission-path forming means receives a second test signal and forms a third signal transmission path along which the second test signal is transmitted through the third delay means to the first input terminal of the semiconductor device, and a fourth signal transmission path along which the second test signal is transmitted through the fourth delay means to the second input terminal of the semiconductor device.

Preferably, according to a tenth aspect of the present invention, the semiconductor device in the test board of the eighth aspect further includes an output terminal capable of outputting a signal obtained from the first input terminal at a setting of a predetermined condition, without logically processing the signal. The test board further comprises: third delay means for delaying a signal to be transmitted therethrough for a third signal propagation delay time; fourth delay means for delaying a signal to be transmitted therethrough for a fourth signal propagation delay time equal to the third signal propagation delay time; and tolerable-output-time delay means for delaying a signal to be transmitted therethrough for a predetermined tolerable output time. The signal-transmission-path forming means further receives a second test signal. In a first mode for testing an output time, the signal-transmission-path forming means forms a first signal transmission path for testing an output time, capable of outputting a signal obtained by transmitting the second test signal through the fourth delay means and the tolerable-output-time delay means, to the outside as a first comparison signal. In a second mode for testing an output time, the signal-transmission-path forming means forms second and third signal propagation paths for testing an output time, along which the first and the second test signals are transmitted through the third and the fourth delay means to the first and the second input terminals, respectively, and a fourth signal transmission path for testing an output time, capable of outputting a signal obtained from the output terminal to the outside as a second comparison signal.

Preferably, according to an eleventh aspect of the present invention, in the first test mode, the signal-propagation-path forming means in the test board of the eighth aspect terminates the first and the second input terminals via first and second terminating resistors, respectively.

Preferably, according to a twelfth aspect of the present invention, the second input terminal in the test board of the eighth aspect includes first and second differential input terminals. Further, the operation of the semiconductor device is controlled by a signal obtained from the first and the second differential input terminals. Further, in the first test mode, the signal-transmission-path forming means applies the first test signal through the second delay means to the first differential input terminal of the second input terminal of the semiconductor device, and applies a fixed voltage to the second differential input terminal.

Preferably, according to a thirteenth aspect of the present invention, in the first test mode, the signal-transmission-path forming means in the test board of the twelfth aspect terminates the first input terminal via a first terminating resistor, and connects the first and the second differential input terminals with a resistance element.

Preferably, according to a fourteenth aspect of the present invention, the first and the second signal transmission paths in the test board of the eighth aspect are formed in such a manner that a transmission path of the first test signal branches into two with a magnetic relay, an MOS transistor, or a power splitter.

Preferably, according to a fifteenth aspect of the present invention, the first and the second delay means in the test board of the eighth aspect are formed of an axial cable determining a delay time according to its length, or an active delay element capable of setting a delay time through a predetermined setting operation.

In the semiconductor device of the first aspect, the input/output buffer cell comprises delay means for delaying the first input signal for a predetermined delay time to output the first delay input signal; first input-signal selecting means for outputting either of the first delay input signal and the second input signal as the first selection signal on the basis of the first test-mode signal; and internal-signal output means for buffering the first input signal to output the internal signal, the operation of the internal-signal output means controlled by the first selection signal.

Thus, in the test state where the first test-mode signal indicating to select the first delay input signal and a signal for test as the first input signal are applied to the first input/output buffer cell, the internal-signal output means is controlled by the first delay input signal which is obtained by delaying the first input signal for a predetermined period of time and buffers the first input signal to output the internal signal.

As a result, only with the application of the signal for test as the first input signal, the setup-time verification test with the aforementioned delay time defined as the setup time can be performed, irrespective of the timing skew of the first input signal to be caused when a tester or the like outputs the first input signal.

The semiconductor device of the second aspect further comprises the second input/output buffer cell for buffering the internal signal to output the output signal to the outside. Thus, in the aforementioned test state, the internal signal can be monitored from the outside as the output signal.

The semiconductor device of the third aspect further comprises the signal control means for controlling the validity or invalidity of outputting the processed signal to the first and the second input/output buffer cells on the basis of the second test-mode signal. Thus, if the second test-mode signal indicating the invalidity of outputting the processed signal to the first and the second input/output buffer cells is applied to the signal control means in the aforementioned test state, the semiconductor device cannot be easily affected by the internal-signal processing circuit.

The semiconductor device of the fourth aspect further comprises the second input-signal selecting means for outputting either of the processed signal and the internal signal as the second selection signal on the basis of the second test-mode signal; and the second input/output buffer cell for buffering the second selection signal to output the output signal to the outside, the operation of the second input/output buffer cell controlled by the second input signal.

If the second test-mode signal indicating to select the internal signal is applied to the second input-signal selecting means in the aforementioned test state, the internal signal can be monitored from the outside as the output signal.

Further, if the second test-mode signal indicating to select the processed signal is applied to the second signal selecting means in normal operation, the processed signal can be outputted as the output signal to the outside. This minimizes the number of output terminals for outputting the processed signal and the internal signal to the outside.

In the semiconductor device of the fifth aspect, the delay means comprises the inverter delay-time control means for controlling the respective signal propagation delay times of the plurality of inverters; and the selector for selectively outputting a signal related to one of the outputs of the plurality of inverters as the first delay input signal.

Thus, a relatively small change of the predetermined delay time is made under the control of the inverter-delay-time control means, and a relatively great change thereof is made through the selection by the selector.

The semiconductor device of the sixth aspect has the comparison means compare the number of reference oscillations and the number of oscillations of the oscillating signal obtained by oscillating the odd number of inverters during a predetermined period, to output the comparison result, and the device also has the control-signal output means determine the aforementioned signal propagation delay time on the basis of the comparison result.

Thus, the predetermined delay time can be accurately set on the basis of the predetermined period of time and the number of reference oscillations.

In the semiconductor device of the seventh aspect, the total signal-propagation delay time of the plurality of inverters is set to be the same as the cycle of the first input signal.

Thus, for the predetermined delay time of not less than the half cycle of the first input signal, the first input signal substantially gains phase lead of {(first input signal cycle)−(predetermined delay time)}.

As a result, only with the application of the signal for test as the first input signal to the first input/output buffer cell, the hold-time verification test with the aforementioned phase lead {(first input signal cycle)−(predetermined delay time)} defined as the hold time can be performed, irrespective of the timing skew of the first input signal to be caused when the tester or the like outputs the first input signal.

In the test board of the eighth aspect, the signal-transmission-path forming means, in the first mode, forms the first signal transmission path along which the first test signal is transmitted through the first delay means to the first input terminal of the semiconductor device; and the second signal transmission path along which the first test signal is transmitted through the second delay means to the second input terminal of the semiconductor device.

Thus, the timing verification test can be performed by applying the signals defining a time difference between the first and the second signal propagation delay times as the setup time or the hold time to the first and the second input terminals. At this time, the test is not affected by the timing skew of the first test signal to be caused when the tester or the like outputs the first test signal. Thus, the high-precision timing verification test can be performed.

In the test board of the ninth aspect, the signal-transmission-path forming means, in the second mode, forms the third signal transmission path along which the second test signal is transmitted through the third delay means to the first input terminal of the semiconductor deceive; and the fourth signal transmission path along which the second test signal is transmitted through the fourth delay means to the second input terminal of the semiconductor device.

The second signal propagation delay time is set longer than the first signal propagation delay time, and the fourth signal propagation delay time is set longer than the third signal propagation delay time.

Thus, the timing verification test in the first test mode can be performed with the time difference between the first and the second signal propagation delay times defined as the setup time, while the timing verification test in the second test mode can be performed with the time different between the first and the second signal propagation delay times defined as the hold time.

Further, if the first and the second test signals in the first test mode are different from those in the second test mode, it becomes possible to disperse the load on the tester or the like for outputting the first and the second test signals.

In the test board of the tenth aspect, the signal-transmission-path forming means, in the first mode for testing an output time, forms the first signal transmission path for testing an output time, capable of outputting the signal obtained by transmitting the second test signal through the fourth delay means and the tolerance output time delay means, to the outside as the first comparison signal. Further, in the second mode for testing an output time, the signal-transmission-path forming means forms the second and the third signal transmission paths for testing an output time, along which the first and the second test signals are transmitted through the third and the fourth delay means to the first and the second input terminals, respectively, and the fourth transmission path for testing an output time, capable of outputting the signal obtained from the output terminal to the outside as the second comparison signal.

Thus, whether the output time of the semiconductor device is within the tolerable output time or not can be judged by sequentially setting the first and the second modes for testing an output time and comparing the time when the change of the second test signal appears in the first comparison signal and the time when the change of the second test signal appears in the second comparison signal.

In the test board of the eleventh aspect, the signal-transmission-path forming means, in the first test mode, terminates the first and second input terminals via the first and the second terminating resistors, respectively. This prevents the occurrence of reflected noise of the signal applied to the first and the second input terminals.

In the test board of the twelfth aspect, the signal-transmission-path forming means, in the first test mode, connects the first test signal through the second delay means to the first differential input terminal of the second input terminal of the semiconductor device, and applies the fixed voltage to the second differential input terminal. This eliminates the skew of the signal applied to the second differential input terminal, thereby achieving a high-precision timing verification test.

In the test board of the thirteenth aspect, the signal-transmission-path forming means, in the first test mode, terminates the first input terminal via the first terminating register, and connects the first and the second differential input terminals with the resistance element. This prevents the occurrence of reflected noise of the signal applied to the first input terminal, and the first and the second differential input terminals.

In the test board of the fourteenth aspect, the first and the second signal transmission paths are formed in such a manner that the transmission path of the first test signal branches into two with the magnetic relay, the transistor or the power splitter.

The use of the magnetic relay or the MOS transistor allows easy control of the validity or invalidity of the first and the second signal transmission paths by the electric signal. On the other hand, the use of the power splitter allows impedance matching before and after the branch, which suppresses the occurrence of reflected noise of the signal applied to the first and the second input terminals.

In the test board of the fifteenth aspect, the first and the second delay means are formed of the axial cable determining the delay time according to its length, or the active delay element capable of setting the delay time through the predetermined setting operation.

The delay time can be relatively easily varied by varying the length of the axial cable or through the predetermined setting operation by the active delay element. This facilitates a variable setting of the first and the second signal propagation delay times.

An object of the present invention is to provide a semiconductor device and a test (DUT) board thereof achieving a high-precision timing verification test irrespective of the timing skew of the tester.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment

Figure 1:
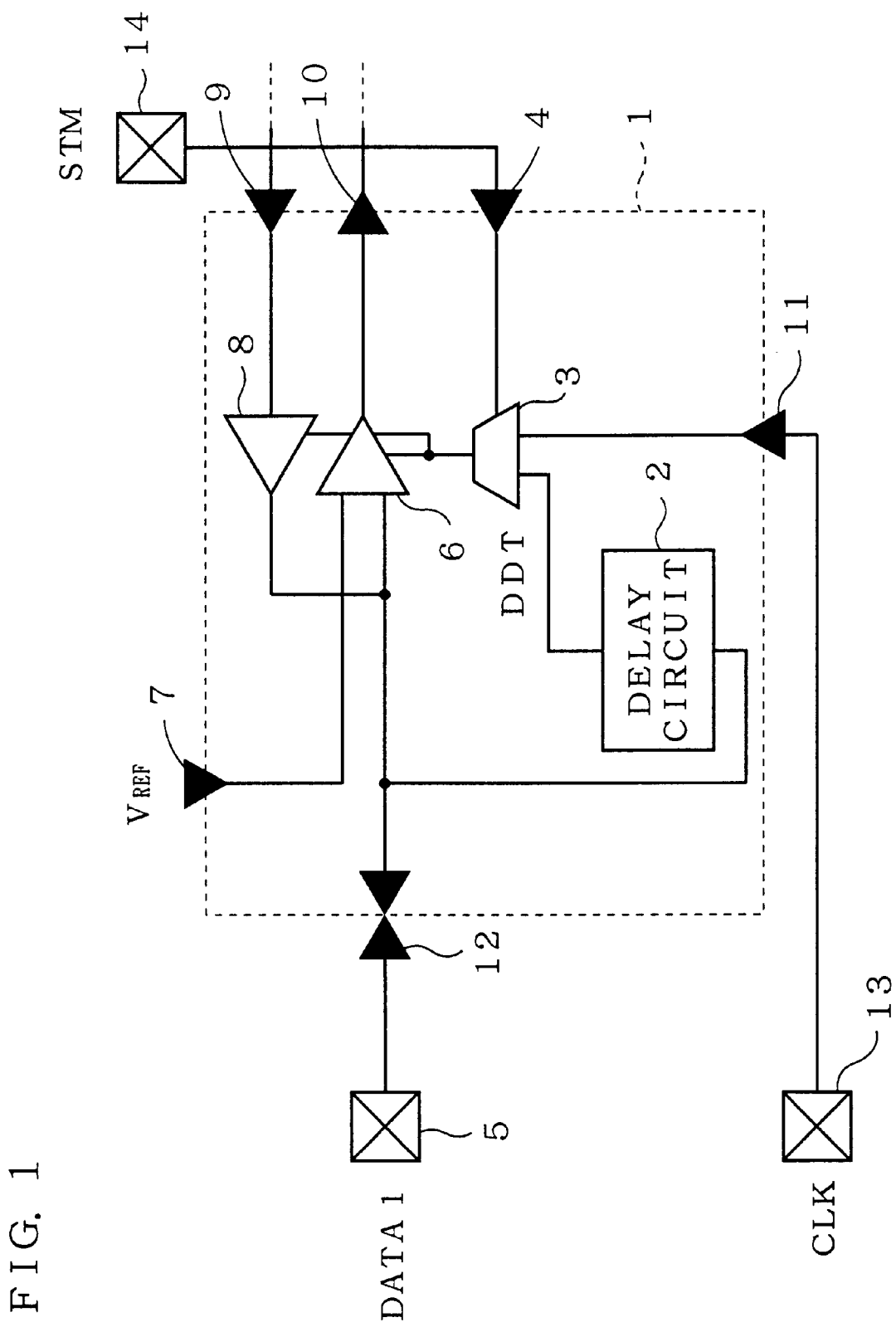
FIG. 1 is a circuit diagram of an internal structure of an I/O buffer cell in an LSI according to a first preferred embodiment of the present invention.

FIG. 1 is a circuit diagram of a structure of an I/O buffer cell in an LSI according to a first preferred embodiment of the present invention.

An I/O buffer cell 1 is capable of transmitting a signal from/to each of a data terminal 5, a clock terminal 13, and a test-mode terminal 14 which are provided as bonding pads or package terminals.

A clock CLK inputted from the clock terminal 13 is applied through a clock input portion 11 to one input of a multiplexer (MUX) 3, while data DATA1 inputted from the data terminal 5 is applied through a data input/output portion 12 to a delay circuit 2 and to one input of a receiver 6.

The delay circuit 2 delays the data DATA1 for a predetermined period of time to output delay data DDT to the other input of the MUX 3. A test-mode signal STM inputted from the test-mode terminal 14 is applied to a control input of the MUX 3. On the basis of the test-mode signal STM, the MUX 3 outputs either the clock CLK or the delay data DDT to respective control inputs of the receiver 6 and a driver 8.

The operation of the receiver 6 and the driver 8 is controlled by the signal obtained from the control inputs. The receiver 6 has the other input thereof receiving a reference voltage VREF through a reference-voltage input portion 7. The reference voltage VREF may be obtained from the outside or may be generated inside the LSI. Then, the receiver 6 compares the data DATA1 and the reference voltage VREF, and performs buffering according to its comparison result to output an internal signal (to be transmitted from/to an internal circuit (not shown) in the LSI) through a signal output portion 10 to the internal circuit.

The driver 8 drives the internal signal obtained through a signal input portion 9 to output its output signal as the data DATA1 through the data input/output portion 12 to the data terminal 5.

A delay time $\Delta t2$ of the delay circuit 2 is obtained by subtracting a delay time $\Delta t3$ of the MUX 3 from the product standard of timing T23 such as a setup time, which is given by: $T23=(\Delta t2+\Delta t3)$.

In normal operation of the LSI with the aforementioned structure of the first preferred embodiment, the test-mode signal STM indicating to select the clock signal CLK is applied to the test-mode terminal 14.

Figure 23:
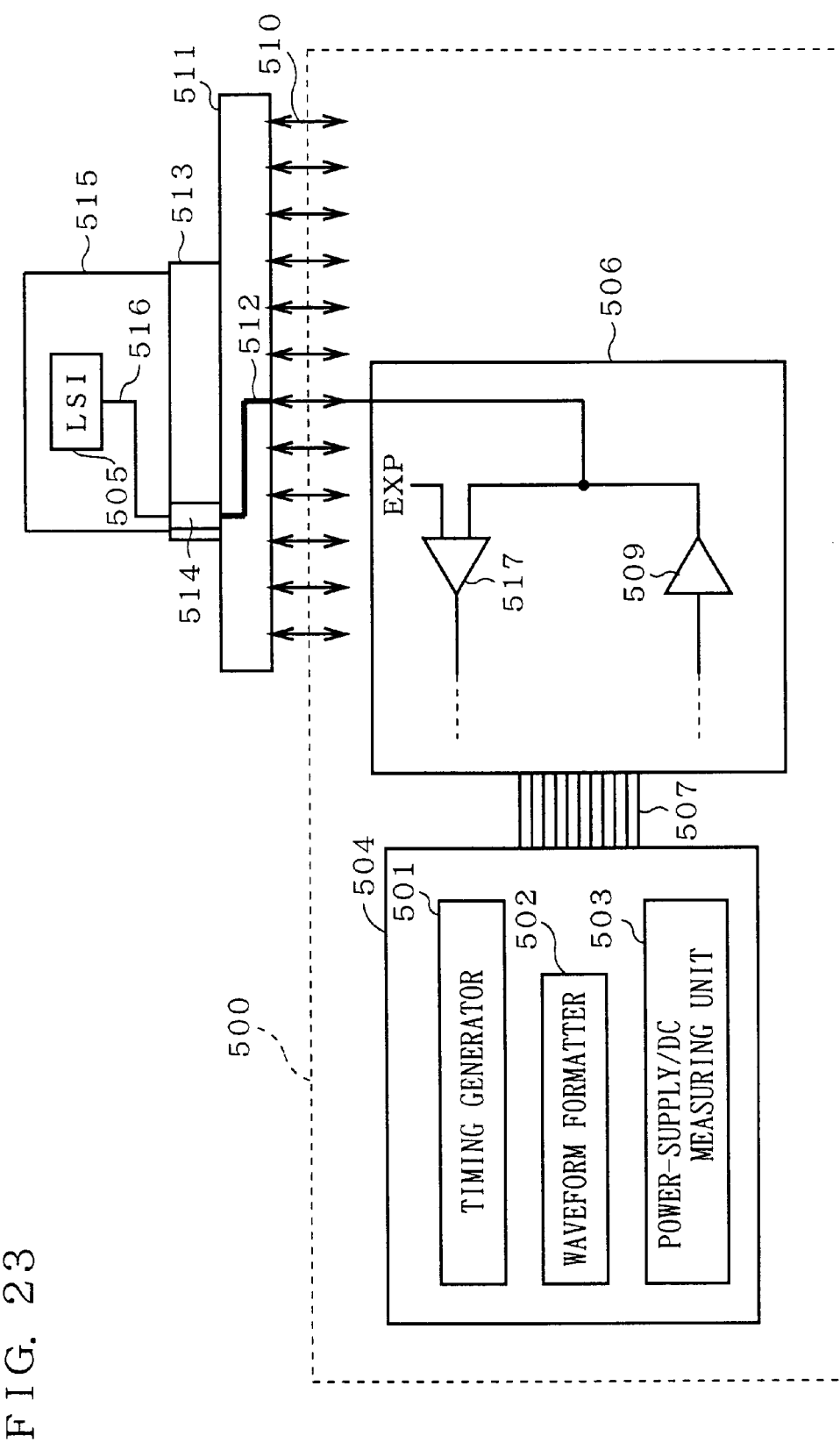
FIG. 23 is an illustration of a structure of the LSI with a LSI tester in the test state.
Figure 24:
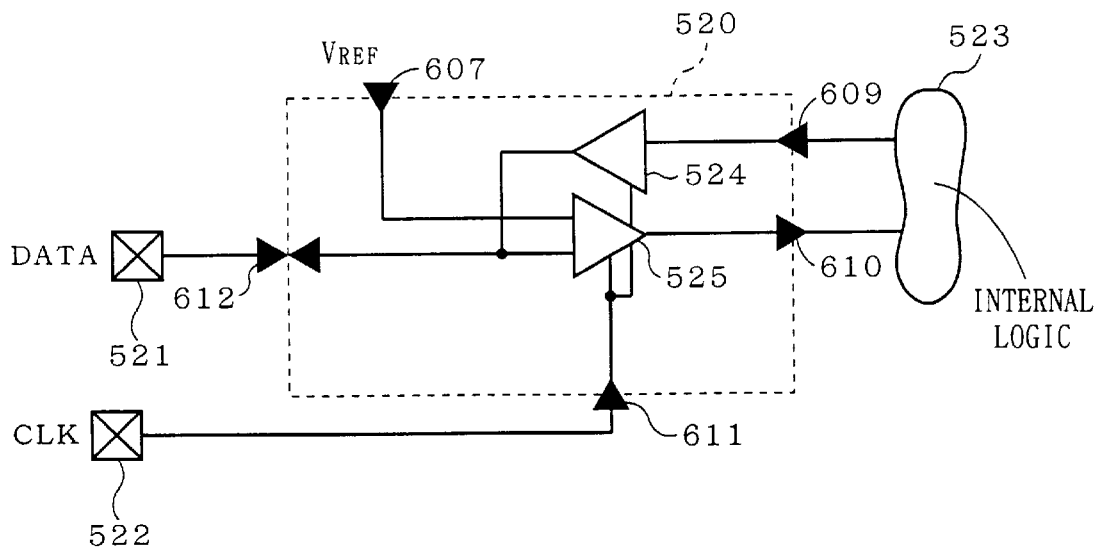
FIG. 24 is a circuit diagram of an internal structure of the I/O buffer cell in the conventional LSI.
Figure 25:
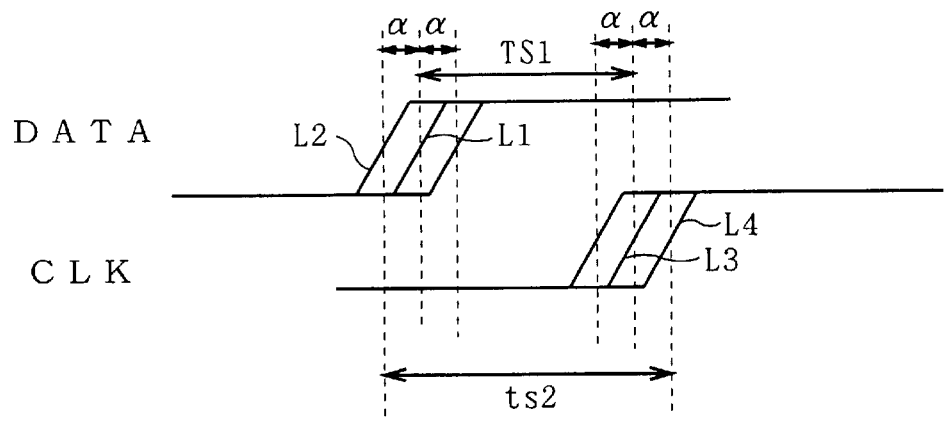
FIG. 25 is a timing chart showing the skew between data and a clock.

On the other hand, the following is, as shown in FIG. 23, the case where the LSI tester 500 performs the timing verification test of the LSI of the first preferred embodiment, using the DUT board 511 and the socket 513.

First, with the test-mode signal STM indicating to select the delay data DDT applied to the test-mode terminal 14, a predetermined clock is applied as the data DATA1 to the data terminal 5. Then, the receiver 6 receives the predetermined clock at its one input, and at its control input, receives a clock which is delayed exactly for the delay time T23 from the predetermined clock.

The delay time T23 of 0.2 ns, for example, allows the high-precision timing verification test of the LSI of the first preferred embodiment with the timing condition that the setup time be 0.2 ns.

At this time, the respective signals applied to the first and the control inputs of the receiver 6 are the same as the clock obtained as the data DATA1, and are transmitted along the same signal propagation path from the LSI tester 500 to the LSI to be test 505. Thus, there is no possibility that signal propagation time variations due to the timing skew of the signal generated by the LSI tester 500 and those due to the respective lengths of the wire 512 of the DUT board 511, the electrode 514 of the socket 513, and the wire 516 of the LSI package 515, may occur in the timing verification test of the LSI of the first preferred embodiment.

As a result, only with the application of the predetermined clock to the data terminal 5 as described above, the high-precision timing verification test of the LSI of the first preferred embodiment can be performed.

Besides, the test device such as the LSI tester 500 does not require high performance for the high-precision timing verification test of the LSI of the first preferred embodiment. Thus, the cost of the test will unlikely increase.

There is also a theoretical possibility in structure that the test-mode signal STM to be applied to the test-mode input portion 4 may be generated inside the LSI on the basis of the data DATA1 obtained from the data terminal 5, with no use of the test-mode terminal 14.

2. Second Preferred Embodiment

Figure 2:
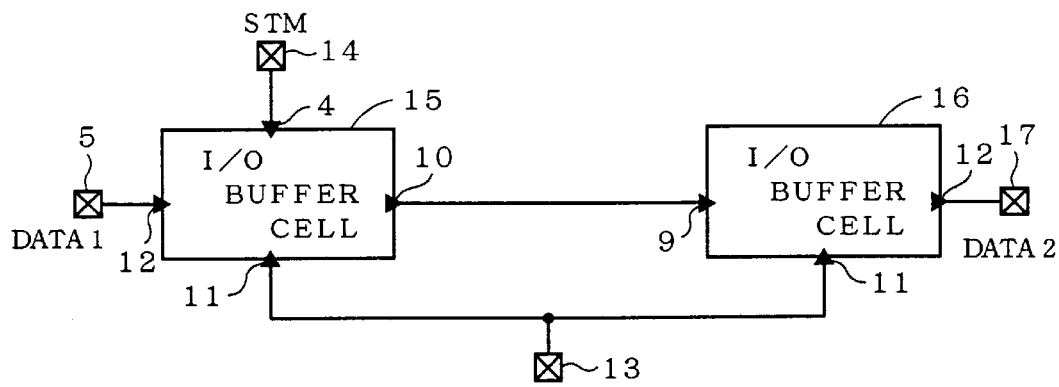
FIG. 2 is an illustration of a peripheral structure of the I/O buffer cell in the LSI according to a second preferred embodiment of the present invention.

FIG. 2 is an illustration of a structure of the LSI according to a second preferred embodiment. As shown, the LSI of the second preferred embodiment is composed of I/O buffer cells 15 and 16. The I/O buffer cell 15 has a similar structure to the I/O buffer cell 1 of the first preferred embodiment shown in FIG. 1, while the I/O buffer cell 16 may be structured upon the I/O buffer cell 1 of the first preferred embodiment in FIG. 1 with the MUX 3 always selecting the clock CLK, or may be structured upon the conventional buffer cell with no delay circuit, no MUX, and no test-mode input portion. In FIG. 2, the same reference numerals or characters indicate the same elements in FIG. 1, to prevent the repetition of the description.

The data DATA1 from the data terminal 5 is applied to the data input/output portion 12, while the test-mode signal STM from the test-mode terminal 14 is applied to the test-mode input portion 4 of the I/O buffer cell 15.

Further, the signal output portion 10 of the I/O buffer cell 15 is in direct connection with the signal input portion 9 of the I/O buffer cell 16. The respective clock input portions of the I/O buffer cells 15 and 16 are connected to the common clock terminal 13 to which the clock CLK is inputted. Then, data DATA2 is outputted from a data terminal 17 through the data input/output portion 12 of the I/O buffer cell 16.

The LSI with such a structure of the second preferred embodiment outputs the data DATA1 which is fetched at the I/O buffer cell 15 in the timing verification test, through the I/O buffer cell 16 and the data terminal 17 to the outside as the data DATA2, by which the contents of the test can be easily monitored.

3. Third Preferred Embodiment

Figure 3:
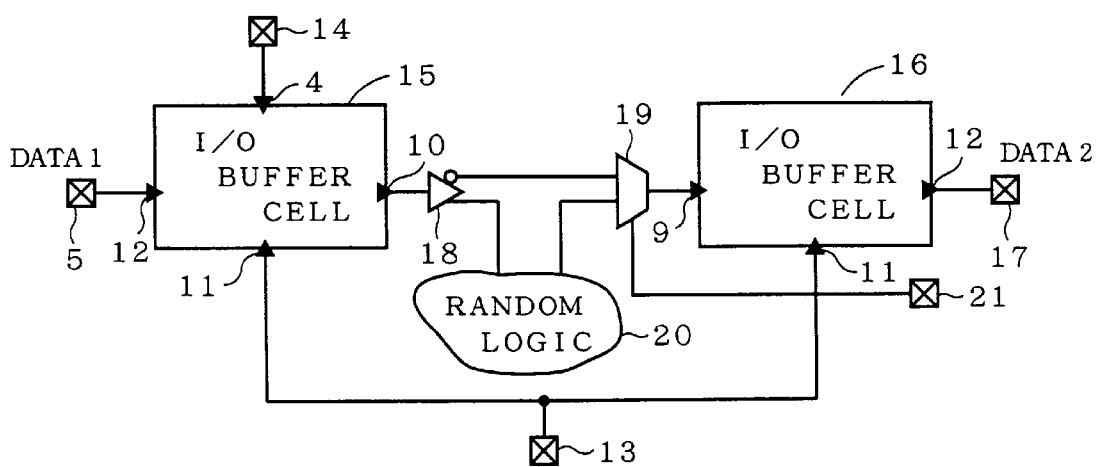
FIG. 3 is an illustration of a peripheral structure of the I/O buffer cell in the LSI according to a third preferred embodiment of the present invention.

FIG. 3 is an illustration of a structure of the LSI according to a third preferred embodiment. As shown, the LSI of the third preferred embodiment is composed of the I/O buffer cells 15 and 16, a buffer 18, a MUX 19, and a random logic 20. The I/0 buffer cells 15 and 16 have similar internal structures as shown in FIG. 2.

The signal output portion 10 of the I/O buffer cell 15 is connected to an input of the buffer 18. The buffer 18 is connected at its one output to one input of the MUX 19, and at its other output to the random logic 20. The MUX 19 receives an output of the random logic 20 at its other input, and at its control input, receives a multiplexer control signal obtained from a test-mode terminal 21.

The other components are similar to those in the LSI of the second preferred embodiment, and thus their description will be omitted.

In normal operation, the LSI with such a structure of the third preferred embodiment applies to the test-mode terminal 14 the test-mode signal STM indicating to the MUX 3 to select the clock CLK, and applies to the test-mode terminal 21 the multiplexer control signal S19 indicating to the MUX 19 to select the output of the random logic 20. This allows the random logic 20 to perform processing operation on the basis of the signal obtained from the signal output portion 10 of the I/O buffer cell 15 and to output its processing result to the signal input portion 9 of the I/O buffer cell 16.

On the other hand, in test operation, the LSI applies to the test-mode terminal 14 the test-mode signal STM indicating to the MUX 3 to select the delay data DDT, and applies to the test-mode terminal 21 the multiplexer control signal S19 indicating to the MUX 19 to select the output of the buffer 18. This allows the LSI to easily output the data DATA1 fetched at the I/O buffer cell 15 through the I/O buffer cell 16 and the data terminal 17 to the outside as the data DATA2.

Using the same data terminal 17 for outputting the processing result of the random logic 20 in normal operation and for outputting the data DATA1 fetched at the 1/O buffer cell 15 in test operation, the LSI of the third preferred embodiment can make an effective use of the external terminal.

The multiplexer control signal S19 to be applied to the control input of the MUX 19 may be generated inside the LSI on the basis of the test-mode signal STM obtained from the test-mode terminal 14, with no use of the test-mode terminal 21.

4. Fourth Preferred Embodiment 4-1. First Structure

Figure 4:
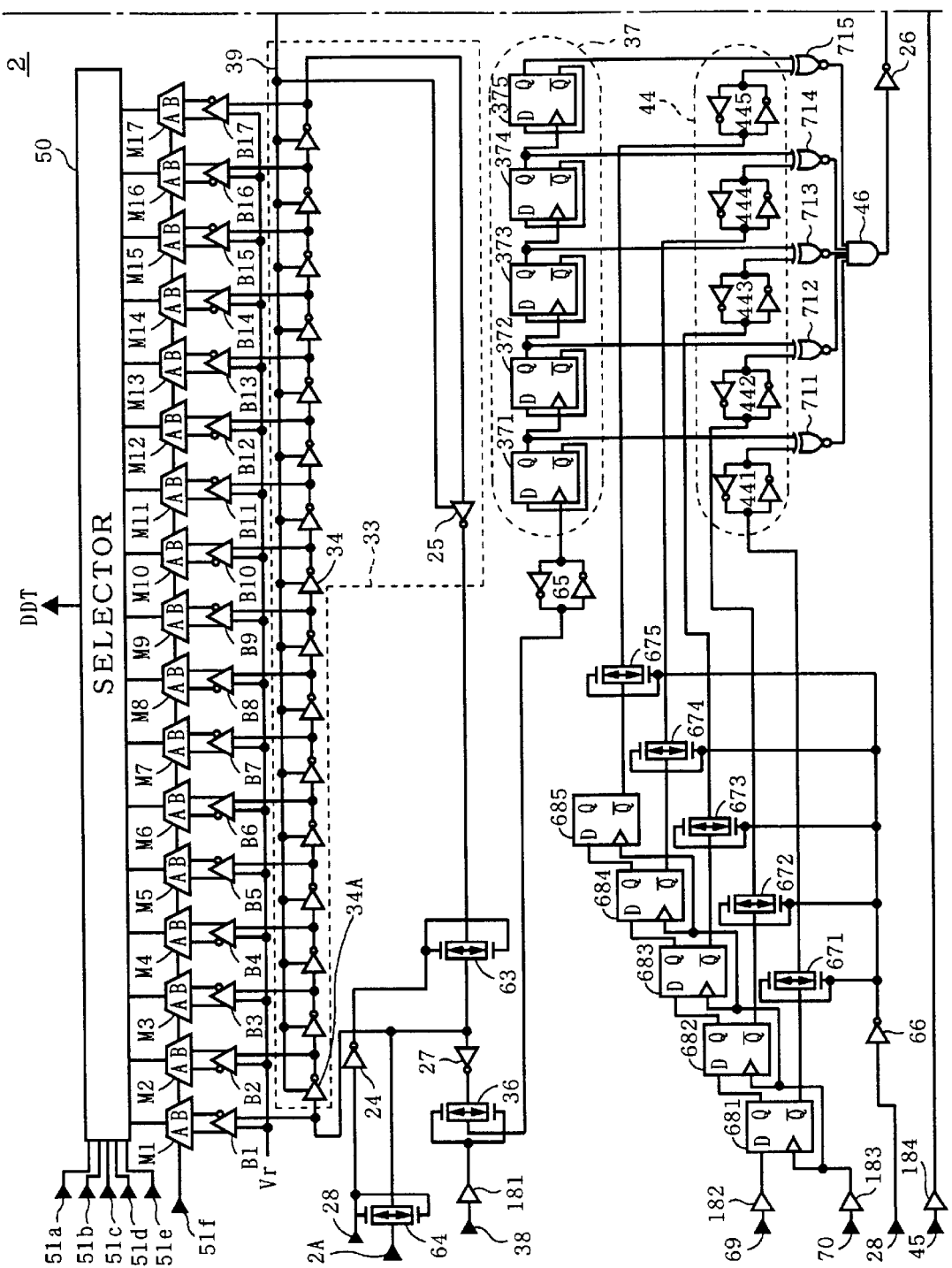
FIGS. 4 and 5 are circuit diagrams of a first structure of a delay circuit in the LSI according to a fourth preferred embodiment of the present invention.
Figure 5:
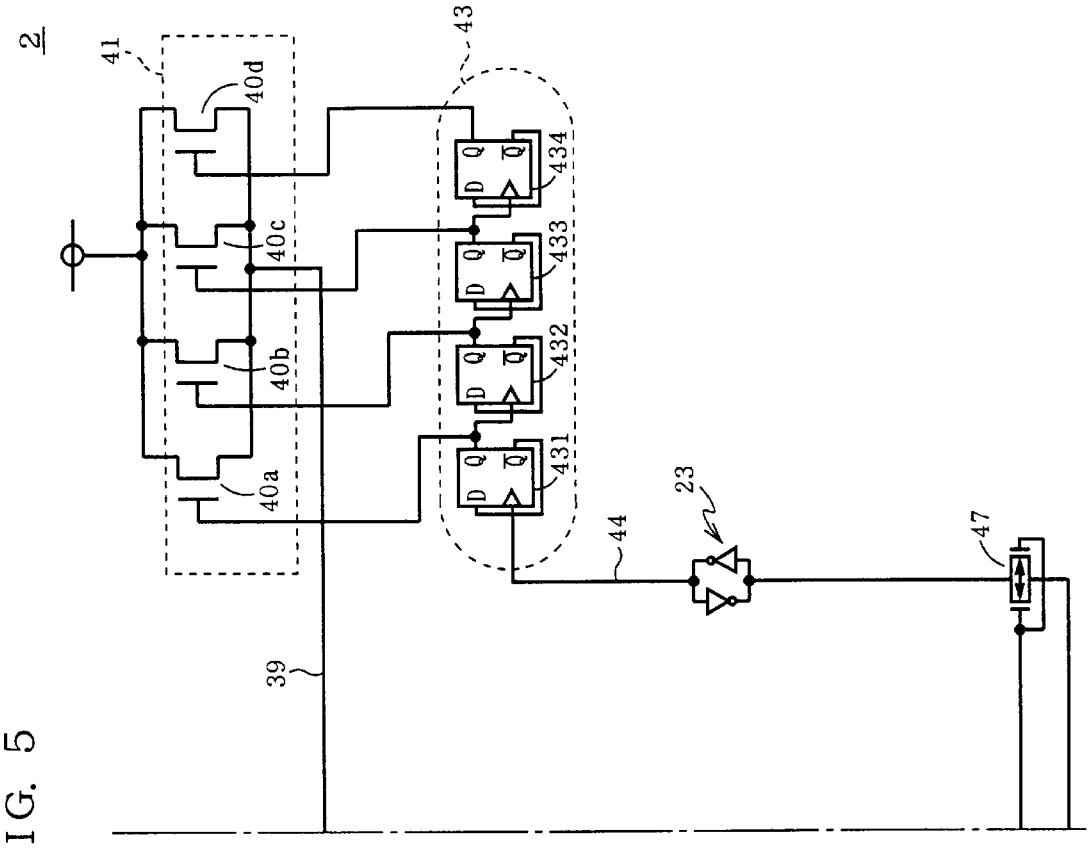

FIGS. 4 and 5 are circuit diagrams of a first internal structure of the delay circuit in the LSI according to a fourth preferred embodiment.

As shown in FIGS. 4 and 5, a signal inputted to an input portion 2A of the delay circuit 2 is applied through a transfer gate 64 to a first-stage inverter 34A in an inverter chain 33 and to an inverter 27.

The inverter chain 33 consists of seventeen series-connected inverters (sixteen inverters 34 and an inverter 25) with the output of the inverter 25 connected through a transfer gate 63 to the input of the first-stage inverter 34A. Namely, the seventeen inverters are in loop connection. The sixteen inverters 34 and the inverter 25 are connected to a common power-supply control line 39 at the control inputs, and apply respective outputs (including the input of the first-stage inverter 34A) to the corresponding first inputs of seventeen (differential) buffers B1 to B17, respectively.

The buffers B1 to B17 have the other inputs thereof receiving a reference voltage Vr. A buffer Bi (i=1, 3, ..., 17) out of the buffers B1 to B17 outputs a non-inverting output to an input A of a multiplexer Mi and an inverting output to an input B of the multiplexer Mi, while a buffer Bj (j=2, 4, ..., 16) out of the buffers B1 to B17 outputs an inverting output to an input A of a multiplexer Mj and a non-inverting output to an input B of the multiplexer Mj.

Each of multiplexers M1 to M17 outputs either of the signals obtained at its inputs A and B, to a selector 50 on the basis of a signal obtained at its control input from an I/O buffer input portion 51.

The selector 50 outputs, as the delay data DDT, a target output out of the outputs of the multiplexers Ml to M17 on the basis of the signals obtained from I/O buffer input portions 51a to 51e.

A signal obtained from a test-mode-related-signal input portion 28 is applied through an inverter 24 to a gate of an NMOS transistor of the transfer gate 63. The signal applied to the test-mode-related-signal input portion 28 is generated inside the LSI on the basis of the test-mode signal STM obtained from the test-mode terminal 14.

A signal obtained from a clock input portion 38 is applied through a buffer 181 to a gate of an NMOS transistor of a transfer gate 36.

The output of the inverter 27 is applied through the transfer gate 36 and a latch portion 65 to a counter 37. The counter 37 consists of five D flip flops 371 to 375 with their outputs Q and their clock inputs connected in series and the clock input of the first D flip flop 371 receiving the output of the latch portion 65. Each of the D flip flops further has an inverting output $\overline{Q}$ thereof connected to its input D.

A signal obtained from a data input portion 69 is applied through a buffer 182 to an input D of a D flip flop 681, while a signal obtained from a scan clock input portion 70 is applied through a buffer 183 commonly to clock inputs of D flip flops 681 to 685.

The D flip flops 681 to 685 have outputs Q and inputs D thereof connected in series, and further have inverting outputs $\overline{Q}$ thereof latched through transfer gates 671 to 675 to latch portions 441 to 445 in a counter resistor 44, respectively.

The signal obtained from the test-mode-related-signal input portion 28 is further inverted by an inverter 66, and is applied commonly to respective gates of NMOS transistors of the transfer gates 671 to 675.

EX-NOR gates 711 to 715 receive the outputs Q of the D flip flops 371 to 375 in the counter 37 at their one inputs, respectively, and receives latch data of the latch portions 441 to 445 in the counter resistor 44 at their other inputs, respectively.

Upon receipt of the outputs of the EX-NOR gates 711 to 715, an AND gate 46 outputs its AND processing result through an inverter 26 to an gate of an NMOS transistor of a transfer gate 47.

A signal obtained from a clock input portion 45 is applied through a buffer 184, the transfer gate 47 and a latch portion 23 to a counter portion 43.

The counter portion 43 consists of four D flip flops 431 to 434 with their outputs Q and clock inputs connected in series. Each of the D flip flops 431 to 434 further has an inverting output $\overline{Q}$ thereof connected to its input D.

The outputs Q of the D flip flops 431 to 434 are applied to gates of NMOS transistors 40a to 40d in a variable resistance portion 41, respectively. The NMOS transistors 40a to 40d are provided in parallel with each other between the power supply and the power-supply control line 39.

In such a structure, the signal propagation delay time (relatively short delay time) per inverter 34 in the inverter chain 33 can be determined by a control potential of the power-supply control line 39. Further, it is possible to control relatively great delay time variations by having the data terminal 5 output, as the delay data DDT, a target output out of the outputs of the multiplexers M1 to M17, on the basis of the signals from the I/O buffer input portions 51a to 51f.

In the seventeen-stage inverter chain shown in FIGS. 4 and 5, if a delay time $\Delta t36$ required to transmit the signal applied to the input portion 2A of the delay circuit 2 to the transfer gate 36 via the inverter chain 33 is set at 1.7 ns, the signal propagation delay time per inverter 34 becomes 100 ps when the counter 37 counts up to seventeen the clock signal propagated in the inverter chain 33 and transmitted to the counter 37 via the transfer gate 63, the inverter 27, the transfer gate 36, and the latch portion 65. Further, if the delay time $\Delta t36$ is set at 510 ps, the signal propagation delay time per inverter 34 becomes 30 ps when the counter 37 counts that clock signal up to seventeen.

An adverse effect of the presence of the inverter 27 may be avoided, for example, by setting the signal propagation delay time of the inverter 27 sufficiently small to be ignored or by setting a count number of the counter 37 with consideration for the signal propagation delay time of the inverter 27.

The delay time $\Delta t36$ can be set by providing a clock having a period of $(2 \cdot \Delta t36)$ from the clock input portion 38 and having the counter 37 count a predetermined edge change (rising "H" or falling "L") of the inverter chain 33 during a "H" period ($\Delta t36$) of that clock (in the ON state of the transfer gate 36). At that time, the transfer gate 63 needs to be in the ON state with a "L" signal provided to the test-mode-related-signal input portion 28.

A preset count value to be latched by the latch portions 441 to 445 in the counter resistor 44 is previously stored as follows: Synchronized with a scan clock to be applied to the scan clock input portion 70, 5-bit serial data is sequentially inputted from the data input portion 69 and written into the D flip flops 681 to 685. The data in the D flip flops 681 to 685 is then latched as the preset count value by the latch portions 441 to 445 in the counter resistor 44. In setting the preset count value to the counter register 44, the transfer gates 671 to 675 need to be in the ON state with a "L" signal provided to the test-mode-related-signal input portion 28.

After the preset count value is set to the counter register 44, a clock with a period of $(2 \cdot \Delta t36)$ is applied from the clock input portion 38, and a clock with a period of not less than two times the period of $(2 \cdot \Delta t36)$ is applied from the clock input portion 45, by which a count value of the counter portion 43 is increased one by one, starting from "1".

When the count value of the counter 37 disagrees with that of the counter register 44, either one of the outputs of the EX-NOR gates 711 to 715 becomes "L". Thus, the output of the AND gate 46 becomes "L", which is inverted to "H" by the inverter 26 and is then applied to the gate of the NMOS transistor of the transfer gate 47. Consequently, the counter portion 43 continues to count the clock applied from the counter-setting-clock input portion 45.

When the count value of the counter 37 agrees with that of the counter register 44, all the outputs of the EX-NOR gates 711 to 715 become "H", and thus the output of the AND gate 46 becomes "H". This ends the count operation in the counter portion 43, by which the control potential of the power-supply control line 39 is determined.

After the control potential of the power-supply control line 39 is determined and the signal-propagation delay time for each of the inverters 34 in the inverter chain 33 and the inverter 24 are set as described above, a "H" test signal is applied to the test-mode-related-signal input portion 28 to put that portion in a test-mode state. Since applicable to the input portion 2A of the delay circuit 2 in this state, the data DATA is transmitted to the first-stage inverter 34 in the inverter chain 33. As previously described, which stage of the inverters 34 in the inverter chain 33 to be selected is determined by the signals from he I/O buffer input portions 51a to 51f.

In this fashion, the delay circuit with the first structure of the fourth preferred embodiment can delay the data DATA for high-resolution delay time inside the chip to output the delay data DDT. This achieves the high-precision timing verification test of the LSI having the delay circuit with the first structure of the fourth preferred embodiment.

The multiplexers M1 to M17 are provided so that the output signals to the selector have the same or inverted truth value as the waveform applied to the input portion 2A of the delay circuit 2, and appropriately select and output the output signals of the buffers B1 to B17, respectively. Further, when a "H" signal is applied to the test-mode-related-signal input portion 28 in the test mode state, the transfer gate 63 is put in the OFF state to prevent self-operation of the inverter chain 33, while the transfer gate 64 is put in the ON state to transmit the data DATA1 to the inverter chain 33. The latch portion 65 is provided to avoid the possibility that the clock input of the D flip flop 371 in the counter 37 may become uncertain in the OFF state of the transfer gate 36.

4-2. Second Structure

Figure 6:
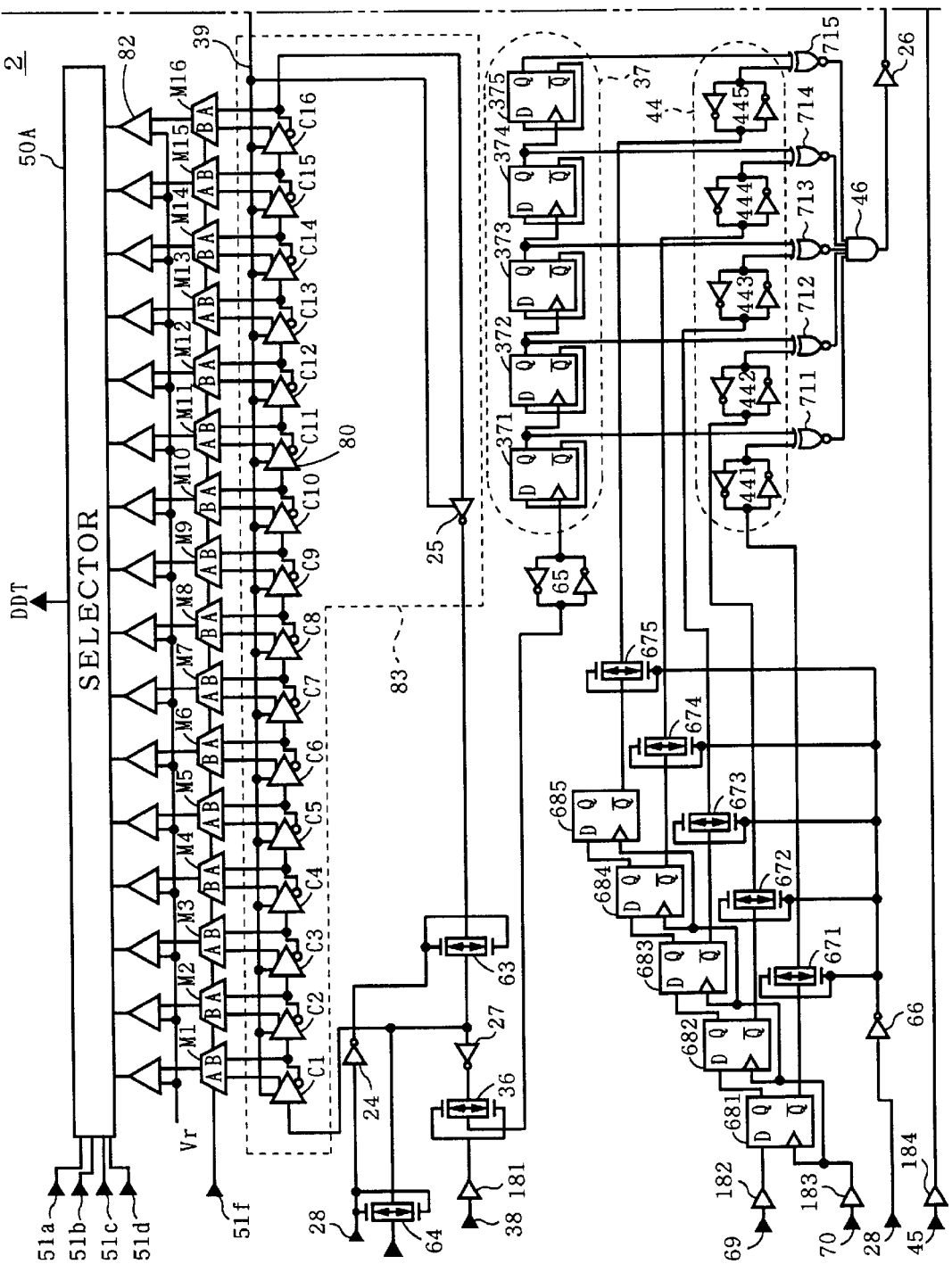
FIGS. 6 and 7 are circuit diagrams of a second structure of the delay circuit in the LSI according to the fourth preferred embodiment.
Figure 7:
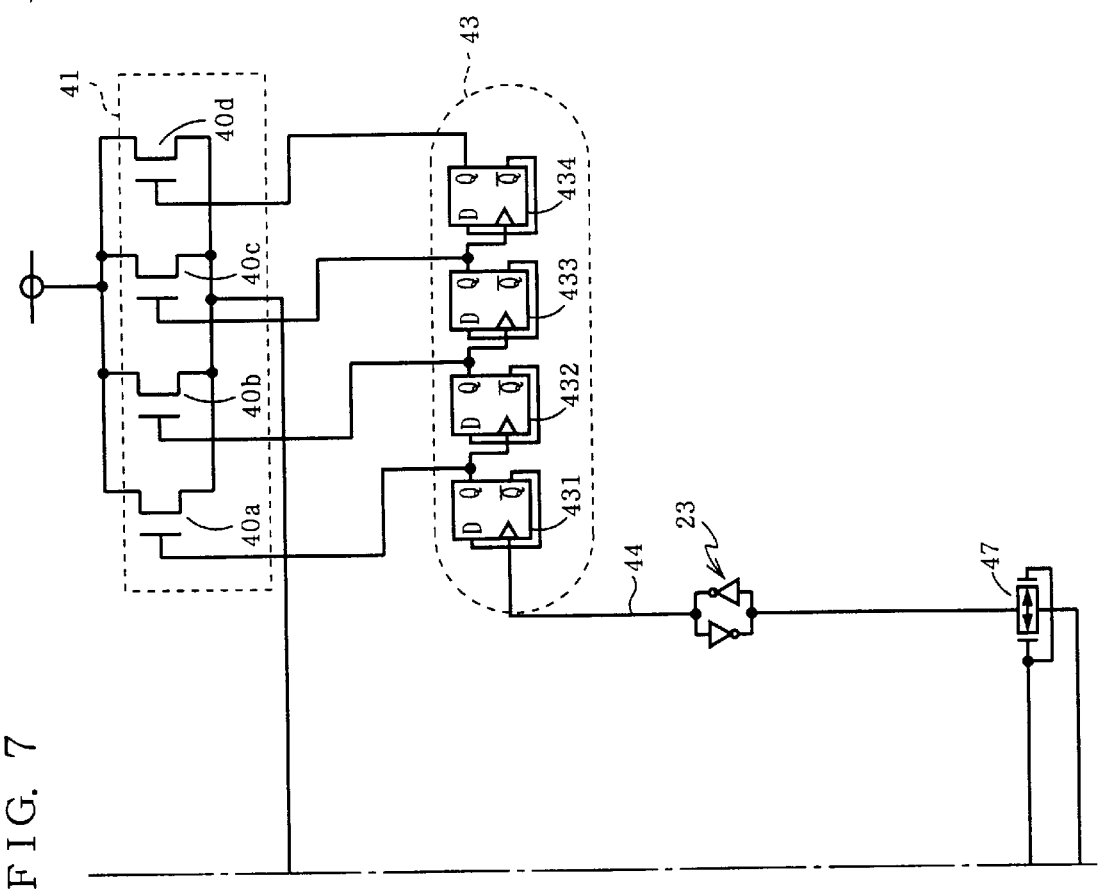

FIGS. 6 and 7 are circuit diagrams of a second internal structure of the delay circuit 2 in the LSI of the fourth preferred embodiment. As shown, an inverter chain 83 consists of seventeen series-connected inverters (sixteen two-output inverters C1 to C16 and the inverter 25) in loop connection.

An inverter Ci (i=1, 3, . . . , 15) out of the two-output inverters C1 to C16 outputs a non-inverting output to an input A of a multiplexer Mi, and an inverting output to an input B of the multiplexer Mi. On the other hand, an inverter Cj (j=2, 4, . . . , 16) out of the two-output inverters C1 to C16 outputs an inverting output to an input A of a multiplexer Mj, and a non-inverting signal to an input B of the multiplexer Mj.

Each of the multiplexers M1 to M16 outputs either of the signals obtained at its inputs A and B to the selector 50A, on the basis of the signal obtained at its control input from the I/O buffer input portion 51f.

The outputs of the multiplexers M1 to M16 are applied via buffers 82 to the selector 50A. The selector 50A outputs, as the delay data DDT, a target output out of the outputs of the multiplexers M1 to M16 obtained via the buffers 82, on the basis of the signals obtained from the I/O buffer input portions 51a to 51d.

The other components are similar to those in the first structure of the delay circuit 2 shown in FIGS. 4 and 5. Like the delay circuit with the first structure, the delay circuit 2 with the second structure of the fourth preferred embodiment can delay the data DATA for high-resolution delay time inside the chip to output the delay data DDT. This achieves the high-precision timing verification test of the LSI having the delay circuit 2 with the second structure.

4-3. Third Structure

If the total delay time required to loop through the sixteen inverters 34 and the inverter 25 in the inverter chain 33 is set so as to match the period of the test clock applied to the input portion 2A in the test state, a hold-time verification test as well as the setup-time verification test can be performed as described below.

For the total delay time of not less than the half period of the test clock, the test clock substantially gains phase lead, given by {(test clock cycle)−(total delay time)}.

As a result, with the aforementioned phase lead {(test clock cycle)−(total delay time)} defined as the hold time, the hold-time verification test can be also performed only with the application of the test clock to the data terminal 5, irrespective of the timing skew of the test clock to be caused when the tester or the like outputs the test clock.

In this fashion, the delay circuit with the third structure of the fourth preferred embodiment can set the delay time for hold-time verification as well as for setup-time verification, by setting the total delay time required to loop through the sixteen inverters 34 and the inverter 25 in the inverter chain 33 so as to match the period of the test clock to be applied to the input portion 2A in the test state.

5. Fifth Preferred Embodiment

5-1. First Structure

While the aforementioned first to fourth preferred embodiments improve the structure of the inside of the LSI chip, especially the circuit structure of the I/O buffer cell, similar improvements can be achieved as well in the structure of the DUT board equipped with the LSI to be test in the test state. This fifth preferred embodiment is directed not to the inside of the LSI but to a DUT board 1 producing timing delays on the signal propagation path between the LSI tester and the terminal (which may be a package or a pad of the LSI chip) of the device (LSI).

Figure 8:
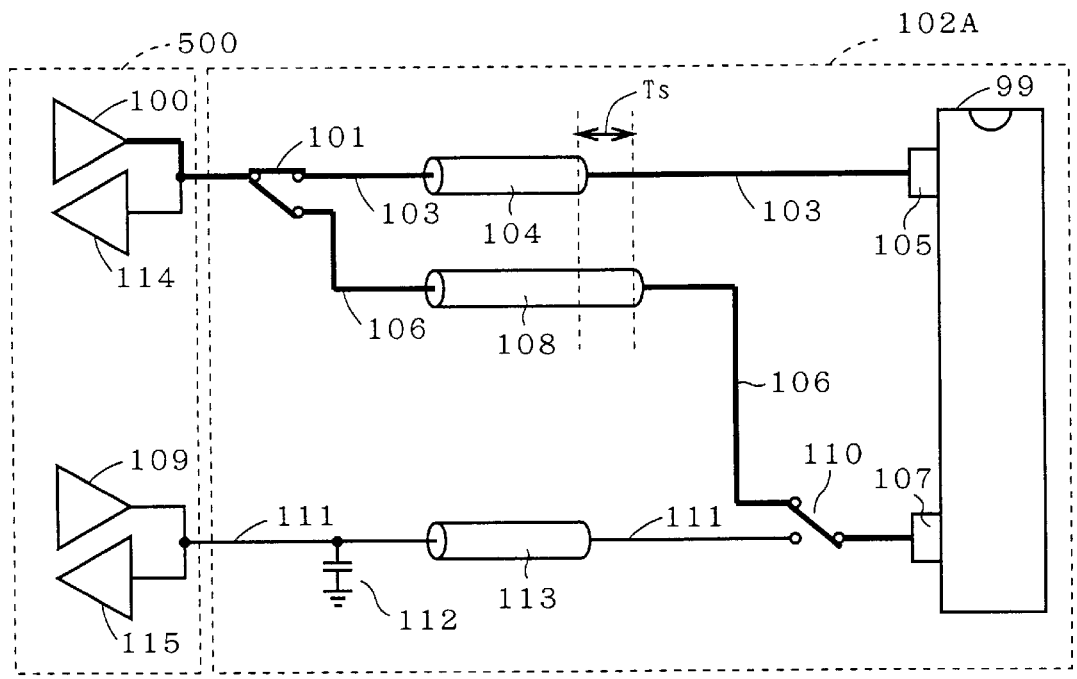
FIG. 8 is an illustration of a first structure of a DUT board according to a fifth preferred embodiment of the present invention.

FIG. 8 is a illustration of a first structure of the DUT board of the fifth preferred embodiment. As shown, a signal outputted from a driver 100 in the LSI tester 500 is transmitted through a (magnetic) relay 101 in a DUT board 102A to a data terminal 105 of a device 99 along a transmission path 103 on which an axial cable 104 is provided.

The signal from the driver 100 is further transmitted through the relay 101 and a relay 110 to a clock terminal 107 of the device 99 along a transmission path 106 on which an axial cable 108 is provided. Further, the output of a driver 109 is connected to a transmission path 111 on which an axial cable 113 is provided.

At this time, the axial cable 108 on the transmission path 106 in the clock system is made longer than the axial cable 104 on the transmission path 103 in the data system by the length corresponding to a setup time Ts. The setup time Ts is, for example, 20 ps.

The output of the driver 100 in the LSI tester 500, connected to the clock terminal 107, is shut off by the relay 110 provided in the vicinity of the device 99. The reason for providing the relay 110 in the vicinity of the device 99 is to eliminate a capacitance load of a stray capacitance 112 on the transmission path 111 of the signal from the driver 109. In FIG. 8, the reference numerals 114 and 115 indicate receivers.

Figure 9:
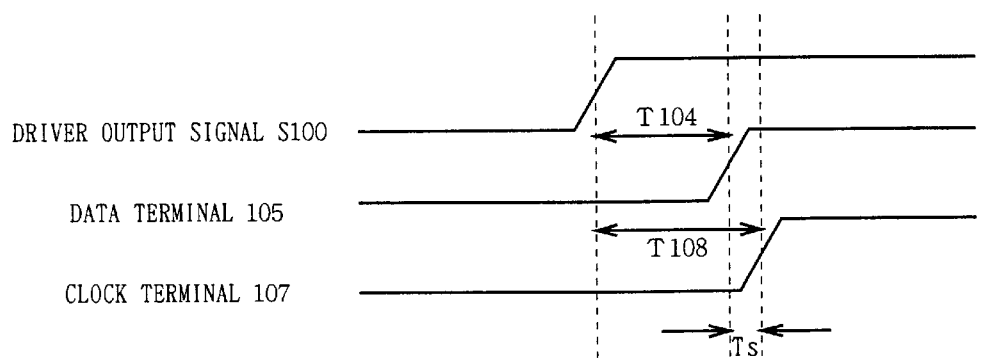
FIG. 9 is a timing chart showing test operation by the DUT board with the first structure of the fifth preferred embodiment.

FIG. 9 is a timing chart of the contents of the timing verification test of the device 99 using the DUT board 102A with the first structure of the fifth preferred embodiment.

As shown, on change in level, an output signal S100 of the driver 100 in the LSI tester 500 is transmitted to the data input terminal 105 after a delay time T104 required for the signal S100 to be propagated through the axial cable 104, and is transmitted to the clock terminal 107 after a delay time T108 (=T104+Ts) required for the signal S100 to be propagated through the axial cable 108.

Thus, if the lengths of the axial cables 104 and 108 are set so that the setup time Ts becomes 0.2 ns, a high-precision timing verification test of the LSI of the first preferred embodiment can be performed with the timing condition that the setup time Ts be 0.2 ns.

At this time, the DUT board 102A transmits the same signal generated by the LSI tester 500 via the relay 101 to the data input terminal 105 and the clock terminal 107 of the device 99. Thus, the timing skew of the signal to be caused by the LSI tester 500 and the signal propagation variations due to the wire 512 of the DUT board 511 cannot occur in the timing verification test of the DUT board 102A with the first structure of the fifth preferred embodiment.

Consequently, the use of the device 99 in the DUT board 102A with the first structure of the fifth preferred embodiment achieves a high-precision timing verification test of the device.

In addition, once the relays are established and the lengths of the axial cables are determined on the DUT board 102A, a physical electrical line length is fixed. Further, since a mass-production factory is managed at a constant temperature, there will be no factor that frustrates the timing in the test environment. This achieves a constant and stable time difference in mass production, thereby achieving the high-precision timing verification test. Further, the adjustment of the lengths of the axial cables allows the timing condition to be easily varied.

5-2. Second Structure

Figure 10:
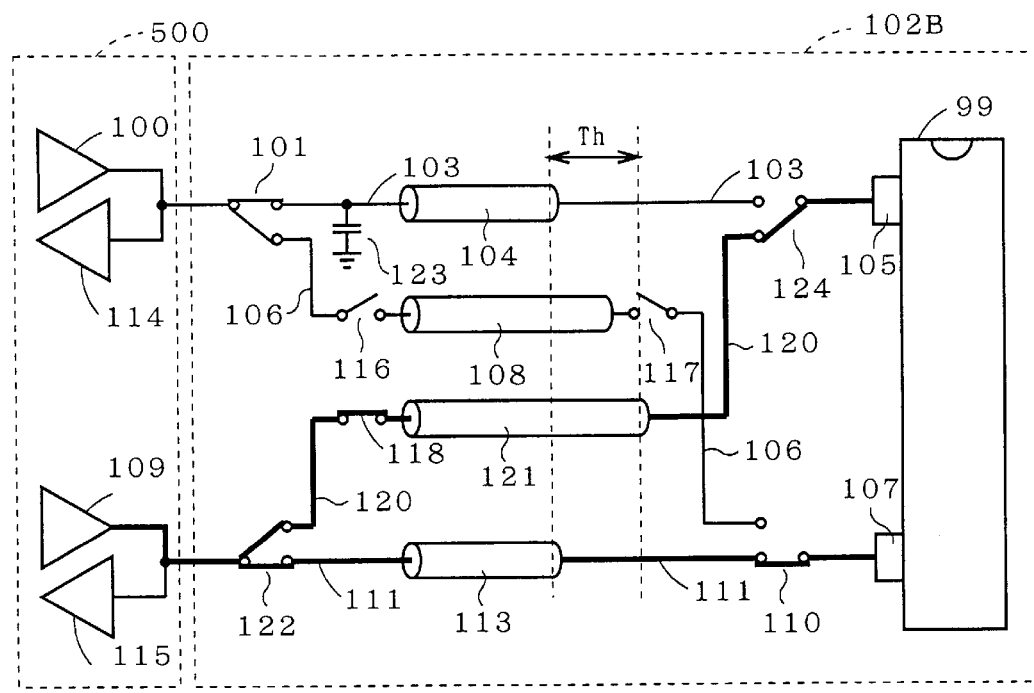
FIG. 10 is an illustration of a second structure of the DUT board according to the fifth preferred embodiment.

FIG. 10 is an illustration of a second structure of the DUT board of the fifth preferred embodiment. As shown, the signal outputted from the driver 109 in the LSI tester 500 is transmitted via a relay 122 on a DUT board 102B to the data terminal 105 of the device 99 along a transmission path 120 on which an axial cable 121 is provided.

The signal from the driver 109 is further transmitted via the relay 122 and the relay 110 to the clock terminal 107 of the device 99 along the transmission path 111 on which the axial cable 113 is provided.

At this time, the axial cable 121 on the transmission path 120 in the data system is made longer than the axial cable 113 on the transmission path 111 in the clock system by a length corresponding to a hold time Ts. The hold time Ts is, for example, 400 ps.

The output of the driver 100 in the LSI tester 500, connected to the data input terminal 105, is shut off by a relay 124 provided in the vicinity of the device 99. The reason for providing the relay 124 in the vicinity of the device 99 is to eliminate a capacitance load of a stray capacitance 123 on the transmission path 103 of the signal from the driver 100 in the LSI tester 500. In FIG. 10, the reference numerals 114 and 115 indicate comparators. Further, the transmission path 106 (axial cable 108) is completely shut off by switches 116 and 117.

Figure 11:
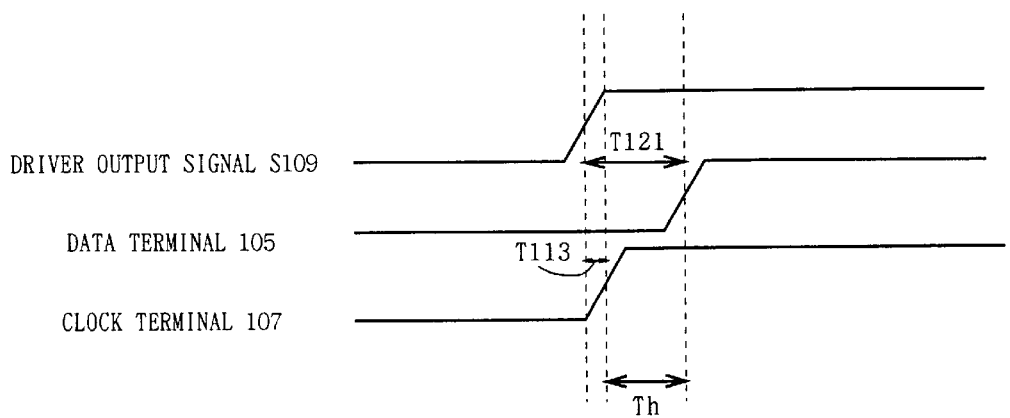
FIG. 11 is a timing chart showing test operation by the DUT board with the second structure of the fifth preferred embodiment.

FIG. 11 is a timing chart showing the contents of the timing verification test of the device 99 using the DUT board 102B with the second structure of the fifth preferred embodiment.

As shown, on change in level, an output signal S109 of the driver 109 in the LSI tester 500 is transmitted to the data input terminal 105 after a delay time T121 required for the signal S109 to be propagated through the axial cable 121, and is transmitted to the clock terminal 107 after a delay time T113 (=T121−Th) required for the signal S109 to be propagated through the axial cable 113.

Thus, if the lengths of the axial cables 121 and 113 are set so that the hold time becomes 0.4 ns, the high-precision timing verification of the LSI of the first preferred embodiment can be conducted with the timing condition that the hold time Th be 0.4 ns.

Consequently, the use of the device 99 in the DUT board 102B with the second structure of the fifth preferred embodiment, as in the DUT board with the first structure, achieves the high-precision timing verification test of the device.

Still more, like the first structure, the second structure of the fifth preferred embodiment can also achieve the timing verification test with the setup time Ts, on the condition that the switches 116 and 117 be turned on, the relay 124 be connected not to the transmission path 120 but to the transmission path 103, and the relay 110 be connected not to the transmission path 111 but to the transmission path 106.

Further, the test with the setup time Ts uses the output of the driver 100 (in the data system), while the test with the hold time Th uses the output of the driver 109 (in the clock system). This is because providing both branches (setup and hold) only to either one of the data and the clock systems causes concentration of loads.

6. Sixth Preferred Embodiment 6-1. Structure

Figure 12:
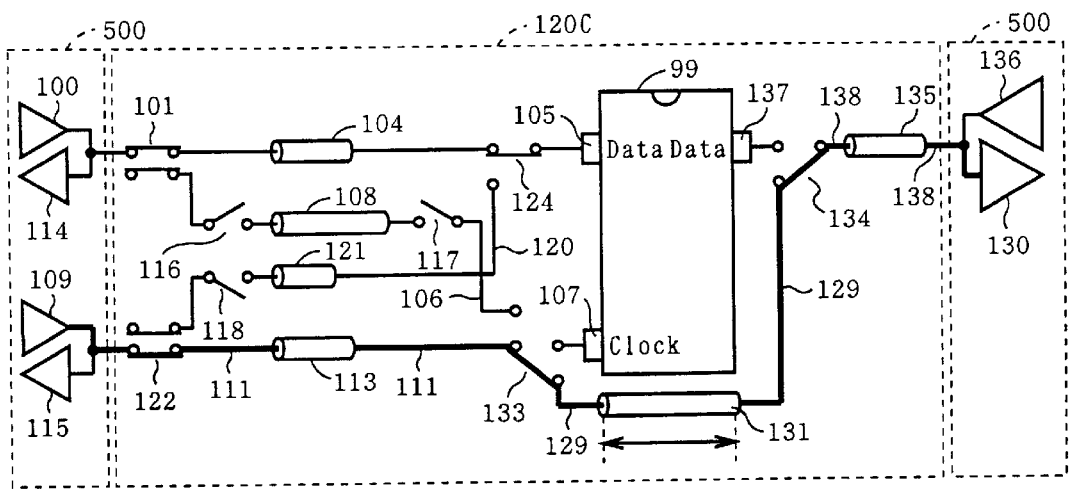
FIGS. 12 and 13 are illustrations of a structure of the DUT board according to a sixth preferred embodiment of the present invention.
Figure 13:
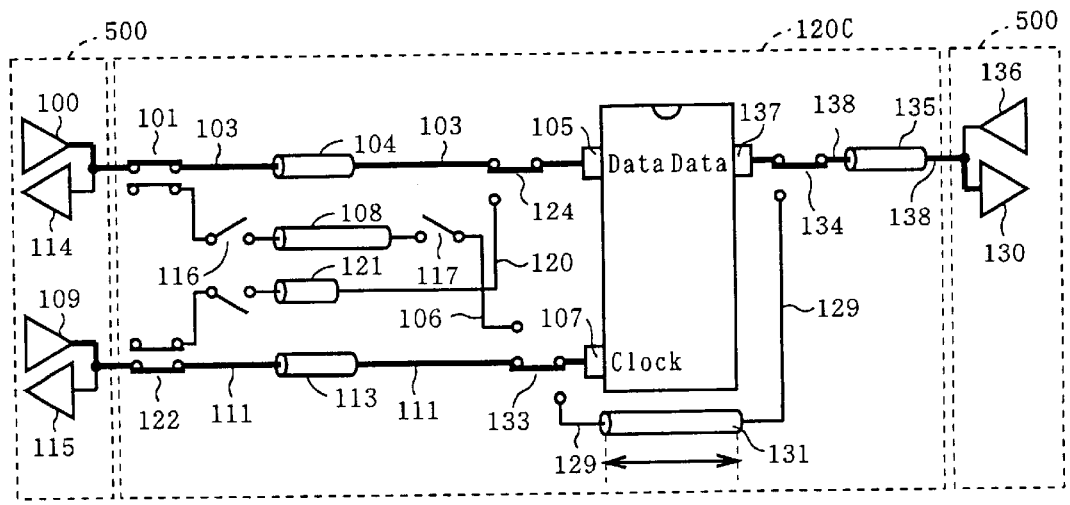

FIGS. 12 and 13 are illustrations of a structure of the DUT board according to a sixth preferred embodiment. As shown, its basic structure is similar to the second structure of the fifth preferred embodiment shown in FIG. 10. We will now describe a DUT board 102C of the sixth preferred embodiment with reference to FIGS. 12 and 13, stressing on points different from the second structure of the fifth preferred embodiment.

The DUT board 102C includes, instead of the relay 110, a relay 133 that controls a connection between either of a clock terminal 107 and a transmission path 129, and either of transmission paths 106 and 111 under its control.

On the transmission path 129, a reference axial cable 131 is provided. The length of the reference axial cable 131 is set to be equivalent to a tolerance output time TQ (Clock to Q) required to output data obtained through the data input terminal 105 at the edge change of the clock applied to the clock terminal 107.

Further, a relay 134 selects a connection of a transmission path 138 to either of an data output terminal 137 and the transmission path 129. An axial cable 135 (delay time T135) is provided on a transmission path 138 that is connected to an input of a comparator 130 and an output of a driver 136 in the LSI tester 500. The other components are similar to those in the second structure of the fifth preferred embodiment shown in FIG. 10.

The DUT 102C with such a structure of the sixth preferred embodiment is equipped with the device 99 whose output time is tested as described below.

First, as shown in FIG. 12, a clock is supplied from the driver 109, with the relay 133 connecting the transmission paths 111 and 129 and the relay 134 connecting the transmission paths 129 and 138. Then, the comparator 130 detects an edge change of a signal obtained by transmitting that clock through the axial cable 113, the reference axial cable 131, and the axial cable 135.

Figure 14:
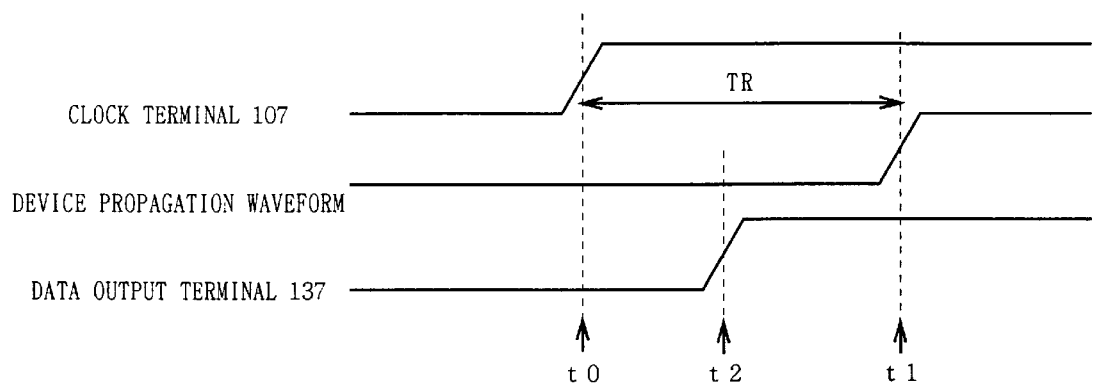
FIG. 14 is a timing chart showing test operation by the DUT board of the sixth preferred embodiment.

In that case, as shown in FIG. 14, the comparator 130 detects the rising edge of the device propagation waveform at a time t1 which is a delay of a reference delay time TR (tolerance output time TQ+T135) behind a rising time t0 of the clock applied to the clock terminal 107.

Next, as shown in FIG. 13, data and a clock are supplied from the driver 100 and the driver 109, respectively, to operate the device 99, with the relay 133 connecting the transmission paths 111 and the clock terminal 107, the relay 134 connecting the data output terminal 137 and the transmission path 138, the relay 101 connecting the output of the driver 100 and the transmission path 103, and the relay 124 connecting the transmission path 103 and the data input terminal 105.

In that case, as shown in FIG. 14, the comparator 130 detects the rising edge of the device propagation waveform at a time t2 which is a delay of an operation delay time TA (output time of the device 99+T135) behind the rising time t0 of the clock applied to the clock terminal 107.

When t2<t1 in comparison, the device 99 is judged as acceptable (PASS) because its output time is shorter than the tolerable output time TQ, while when t2>t1, the device 99 is judged as defective (FAIL) because its output time is longer than the tolerable output time TQ.

In this fashion, in this sixth preferred embodiment, the comparison between the times t1 and t2 is made on the same condition for the clock to be applied to the clock terminal 107. This allows an accurate judgment about the output time of the device 99.

The advantage of detecting the times t1 and t2 by the same comparator 130 is that the timing comparison verification of the rising edge of the clock can be performed with no variations in skew due to the use of different comparators and with minimum timing of the LSI tester 500.

6-2. Concrete Example of Internal Structure of Device

Figure 15:
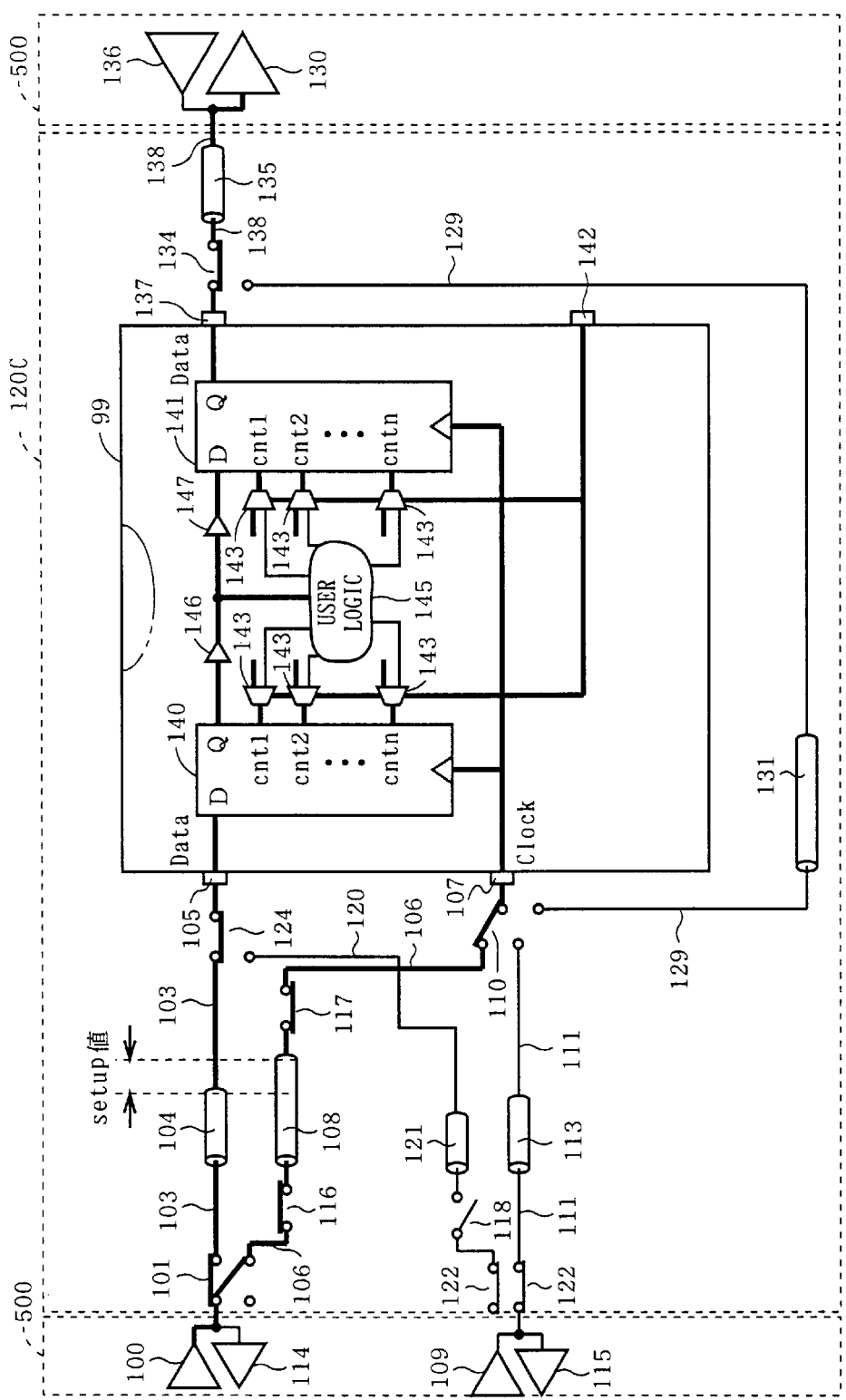
FIG. 15 is an illustration showing a concrete example of the case where the DUT board of the sixth preferred embodiment performs a test of the device.

FIG. 15 is an illustration showing a concrete example of the test of the device 99 using the DUT board 102C of the sixth preferred embodiment. Shown in the figure is specification of the connection of the buffer cells within a chip of the device 99. The specification of the relay connection on the DUT board shows the state of setup verification test.

As to the I/O buffer cells to be test within the device 99, it is reliable to use I/O buffer cells 140 and 141 to be used by the user in actual practice. Thus, the specification which can be used both for user functions and for test, as shown in FIG. 15, is desirable.

In the device 99, an MUX 143 is inserted between a test-mode terminal 142 and each of respective input portions cnt1 to cntn of the I/O buffer cells 140 and 141. Each MUX 143 is connected at its one input to an user logic 145, and receives a control signal (which may be provided from a fixed voltage inside or from the outside) at its other input. Then, on the basis of a signal from the test-mode terminal 142, the MUX 143 outputs either of the signals obtained at its inputs to the corresponding input portion out of the respective input portions cnt1 to cntn of the I/O buffer cells 140 and 141.

An output Q of the I/O buffer cell 140 is applied through a buffer 146 to the user logic 145 and to an input of a buffer 147. An output of the buffer 147 is then applied to an input D of the I/O buffer cell 141.

In such a device 99, the I/O buffer cells 140 and 141 are directly coupled with each other by the application of a signal indicating to select the other input of the MUX 143, through the test-mode terminal 142. The aforementioned control signal is set so that each of the I/O buffer cells 140 and 141 can output its input D directly as its output Q.

At this time, the operation result of the user logic 145 is rendered void. Thus, in testing the device 99, the data applied to the data input terminal 105 can be certainly monitored from the data output terminal 137.

Namely, in the device 99 with the structure shown in FIG. 15, the setup time verification can be relatively easily monitored without providing a signal indicating to the user logic 145 to directly couple the I/O buffer cells 140 and 141 (a normal LSI has no wire directly coupling the I/O buffer cells 140 and 141 as shown in FIG. 15).

In order to reduce a load of the wiring capacitance of the user logic 145, in layout, the I/O buffer cell 140 on the input side is preferably provided as close as to the I/O buffer cell 141 on the output side. Further, because of somewhat increased load of the wiring capacitance of the user logic 145, the buffers 146 and 147 are provided for an improvement of the signal waveforms.

7. Seventh Preferred Embodiment

Figure 16:
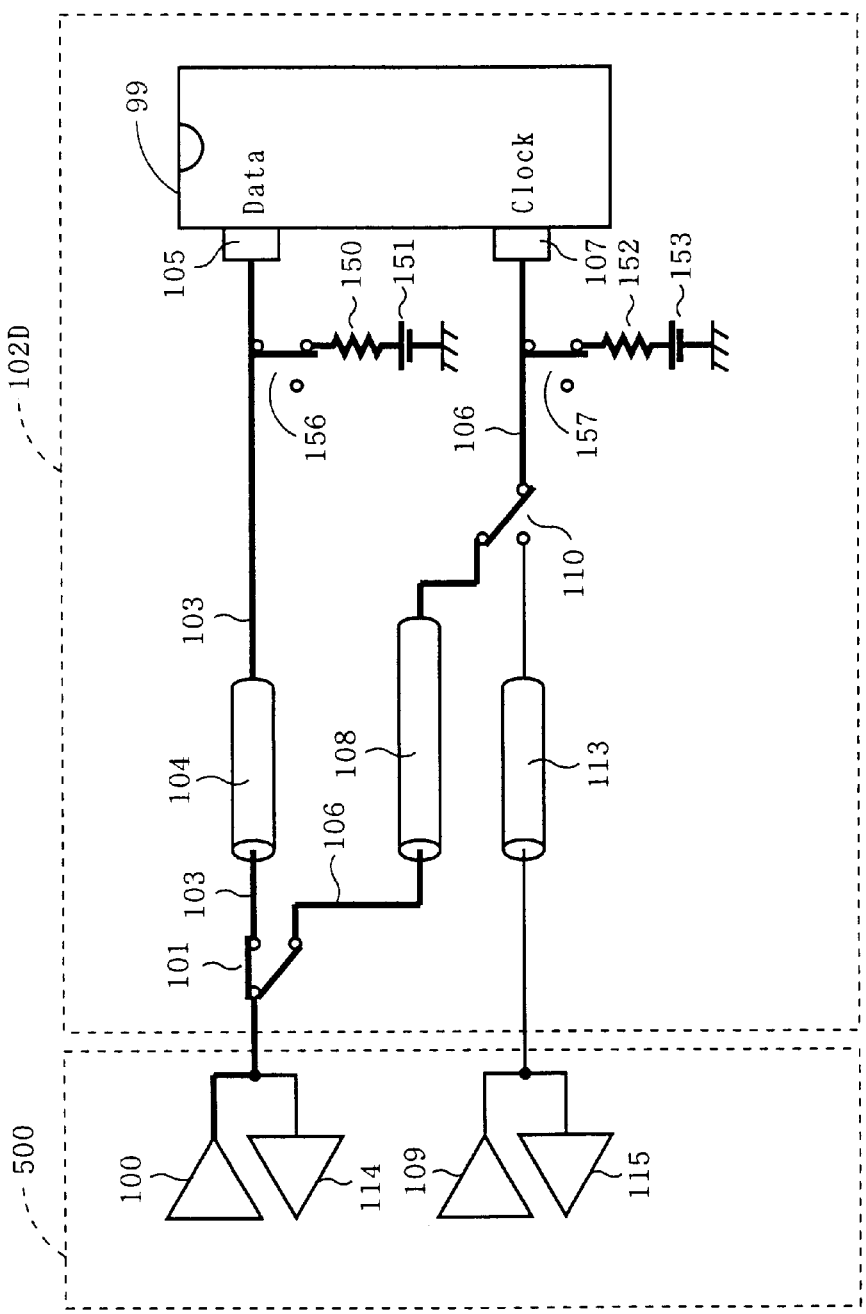
FIG. 16 is an illustration of a structure of the DUT board according to a seventh preferred embodiment of the present invention.

FIG. 16 is an illustration of a structure of a DUT board according to a seventh preferred embodiment. As shown, in a DUT board 102D, the data input terminal 105 terminates with its end connected via a terminating resistor 150 to a constant-voltage source 151. Similarly, the clock terminal 107 terminates with its end connected via a terminating resistor 152 to a constant-voltage source 153.

As described above, the DUT board 102D of the seventh preferred embodiment terminates the data input terminal 105 and the clock terminal 107 of the device 99 with the terminating resistors 150 and 152, respectively. This prevents the occurrence of reflected noise of the signal applied to the data input terminal 105 and the clock terminal 107.

Further, in order to improve the effect of preventing the occurrence of reflected noise, it is desirable to set each resistance value of the terminating resistors 150 and 152 about the same level as wiring impedance of the transmission paths 103 and 106, and to arrange the terminating resistors 150 and 152 in the vicinity of the terminals 105 and 107 (near pins of the socket) of the device 99. The other structures are similar to those in the first structure of the fifth preferred embodiment shown in FIG. 8.

8. Eighth Preferred Embodiment

Figure 17:
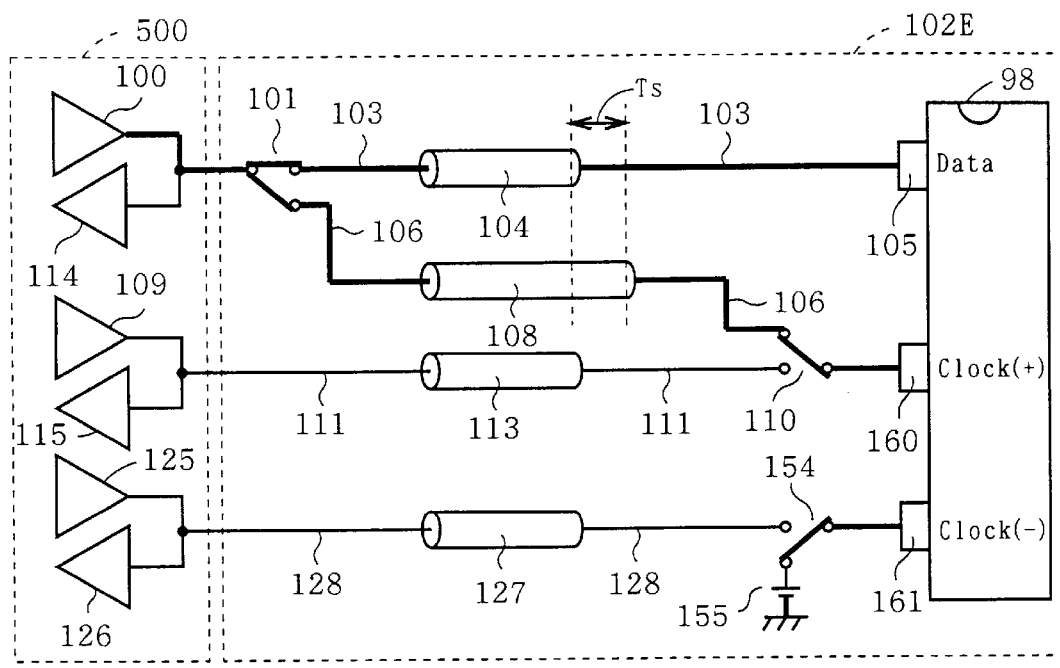
FIG. 17 is an illustration of a structure of the DUT board according to an eighth preferred embodiment of the present invention.

FIG. 17 is an illustration of a structure of the DUT board according to an eighth preferred embodiment. As shown, the signal outputted from the driver 100 in the LSI tester 500 is transmitted via the relay 101 on a DUT board 102E to the data terminal 105 of a device 98 along the transmission path 103 on which the axial cable 104 is provided.

The signal from the driver 100 is further transmitted via the relays 101 and 110 on the DUT board 102E to a first differential clock terminal 160 along the transmission path 106 on which the axial cable 108 is provided. The relay 110 selects a connection of the first differential clock terminal 160 to either of the transmission paths 116 and 111.

At this time, the axial cable 108 on the transmission path 106 in the clock system is made longer than the axial cable 104 on the transmission path 103 in the data system by the length corresponding to the setup time Ts.

Further, the output of the driver 109 is connected to the transmission path 111, while the output of a driver 125 is connected to a transmission path 128. On the transmission paths 111 and 128, the axial cables 113 and 127 are provided, respectively.

A relay 154 selects a connection of a second differential clock terminal 161 to either of the transmission path 128 and a constant-voltage source 155. The constant-voltage source 155 preferably has an intermediate potential V155 between "H" and "L".

In the DUT board 102E with such a structure of the eighth preferred embodiment, as shown in FIG. 17, the timing verification of the device 98 is performed with the relay 110 connecting the transmission path 106 and the first differential clock terminal 160 and the relay 154 connecting the constant-voltage source 155 and the second differential clock terminal 161.

Figure 18:
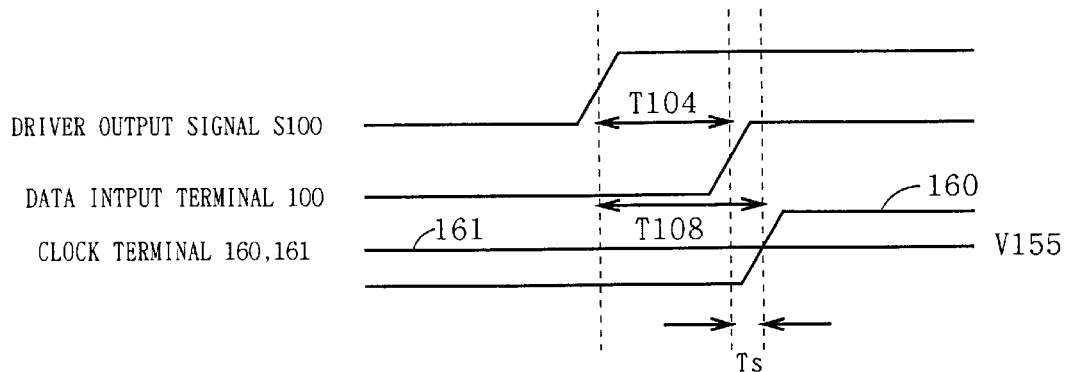
FIG. 18 is a timing chart showing test operation by the DUT board of the eighth preferred embodiment.

FIG. 18 is a timing chart showing the contents of the timing verification test of the device 98 using the DUT board 102E with the structure of the eighth preferred embodiment.

As shown, on change in level, the output signal S100 of the driver 100 in the LSI tester 500 is transmitted to the data input terminal 105 after a delay time T104 required for the signal S100 to be propagated through the axial cable 104, and is transmitted to the first differential clock terminal 160 after a delay time T108 (=T104+Ts) required for the signal S100 to be propagated through the axial cable 108.

Thus, like the DUT board with the first structure of the fifth preferred embodiment, the DUT board 102E of the eighth preferred embodiment can achieve the high-precision timing verification test of the device 98 with the timing condition that the setup time be 0.2 ns.

Further, the second differential clock terminal 161 is fixed at the potential of V155. This completely eliminates the clock edge skew of the second differential clock terminal 160 (timing edge skew between the outputs of the drivers 109 and 125 in the LSI tester 500), thereby improving accuracy in the timing verification test of the device 98.

9. Ninth Preferred Embodiment 9-1. Structure

Figure 19:
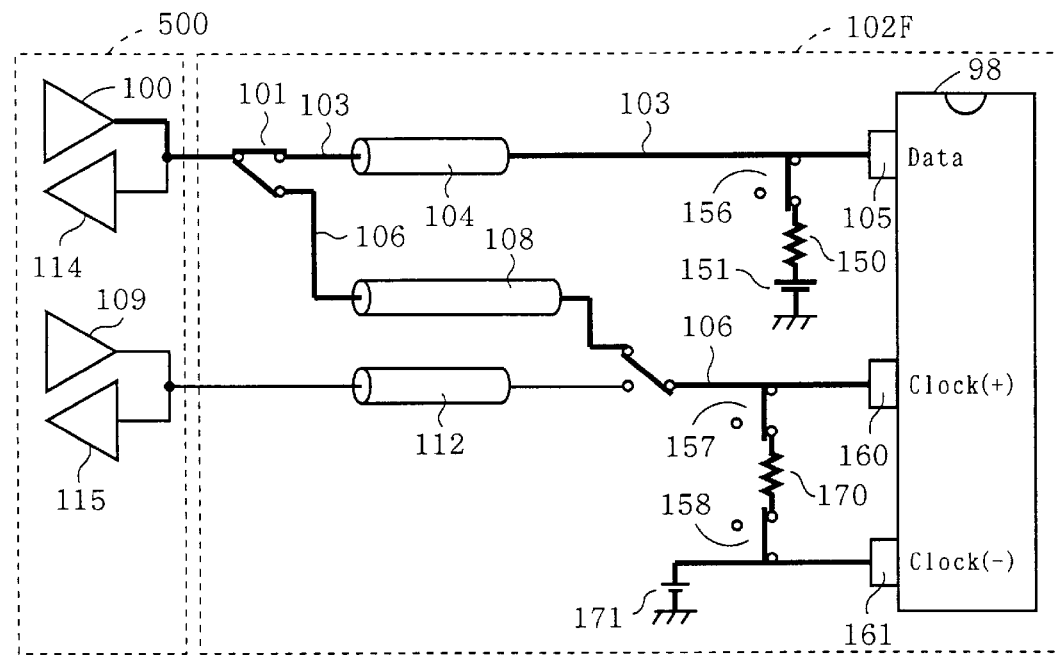
FIG. 19 is in illustration of a structure of the DUT board according to a ninth preferred embodiment of the present invention.

FIG. 19 is an illustration of a structure of the DUT board according to a ninth preferred embodiment. As shown, on a DUT board 102F in the setup-time verification test mode, the data input terminal 105 terminates with its end connected via a relay 156 and the terminating resistor 150 to the constant-voltage source 151.

Further, in the setup-time verification test mode, the first and the second differential clock terminals are connected to each other via relays 157 and 158 and a resistance element 170. The second differential clock terminal 161 is further connected to a constant-voltage source 171.

As described above, the DUT board 102F of the ninth preferred embodiment terminates the data input terminal 105 of the device 98 with the terminating resistor 150, and connects the first and the second differential clock terminals 160 and 161 via the resistance element 170. This prevents the occurrence of reflected noise of the signals applied to the data input terminal 105 and the first and the second differential clock terminals 160 and 161.

In order to improve the effect of preventing the occurrence of reflected noise, it is desirable to set the resistance value of the terminating resistor 150 about the same level as the wiring impedance of the transmission path 103, and to set the resistance value of the resistance element 170 with consideration of the wiring impedance of the transmission path 106 plus an internal resistance of the device 98. Further, the terminating resistor 150 and the resistance element 170 are preferably arranged in the vicinity of the terminals 105 and 107 (near the pins of the socket) of the device 98. The other components are similar to those of the eighth preferred embodiment shown in FIG. 17.

Figure 20:
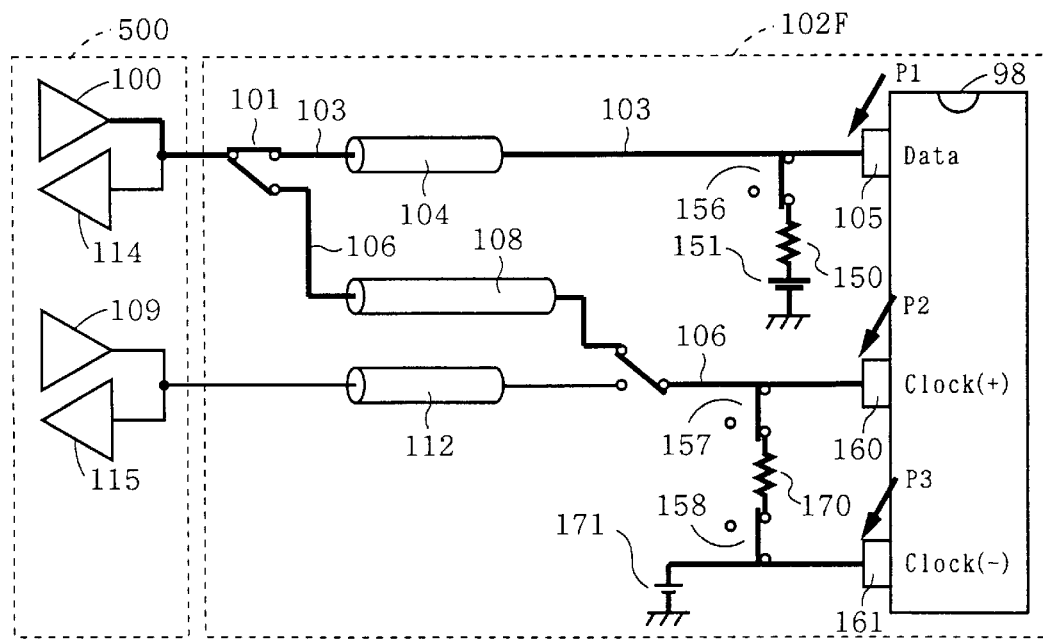
FIG. 20 is an illustration showing observation points in simulation of test operation by the DUT board of the ninth preferred embodiment.

FIG. 20 is an illustration of a simulation of waveforms of the signals transmitted in the timing verification test of the device 98 using the DUT board 102F of the ninth preferred embodiment. As shown, the waveforms of the data input terminal 105, the first differential clock terminal 160, and the second differential clock terminal 161 are observed at first to third observation points P1 to P3, respectively.

9-2. Simulation Result

Figure 21:
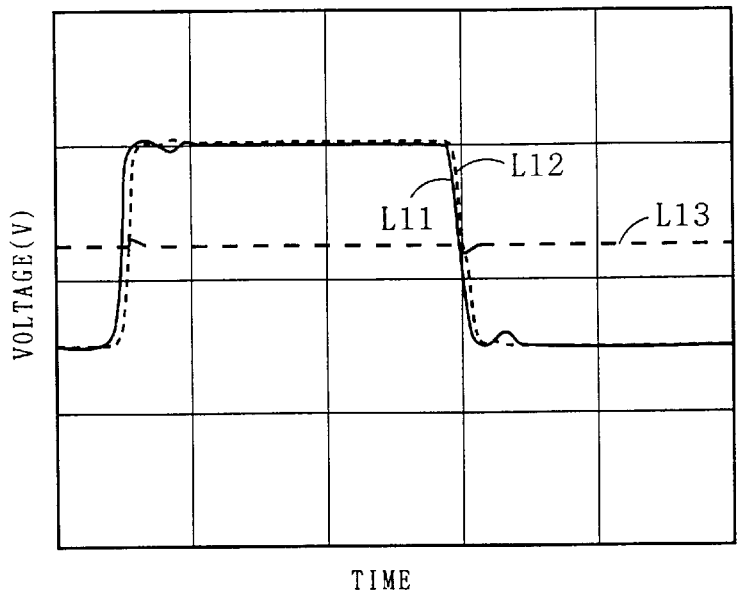
FIG. 21 is a graph showing the simulation result (in low-speed clock input) of the test operation by the DUT board of the ninth preferred embodiment.
Figure 22:
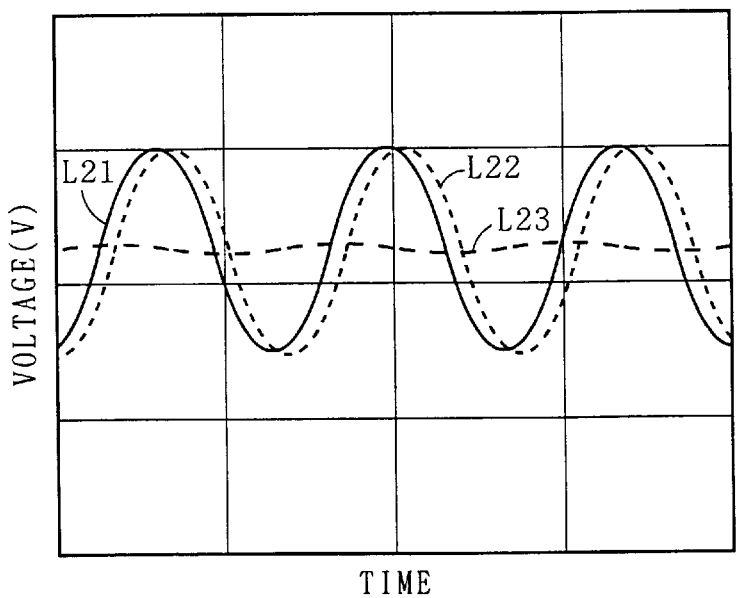
FIG. 22 is a graph showing the simulation result (in high-speed clock input) of the test operation by the DUT board of the ninth preferred embodiment.

The simulation results observed at the first to the third observation points P1 to P3 in FIG. 20 are shown in FIGS. 21 and 22. FIG. 21 shows the simulation results with a relatively low-speed clock applied to the first differential clock terminal 160; FIG. 22 shows the simulation results with a relatively high-speed clock applied to the first differential clock terminal 160.

In FIG. 21, waveforms L11 to L13 indicates the simulation results at the observation points P1 to P3, respectively. As shown, the waveforms L11 and L12 testify the stable ringing and reflected noise, and the waveform L13 testifies the stable potential.

In FIG. 22, waveforms L21 to L23 indicates the simulation results at the observation points P1 to P3, respectively. As shown, the waveforms L21 and L22 testify the stable ringing and reflected noise, and the waveform L23 testifies the relatively stable potential. It is understood from FIG. 22 that the terminating resistor 150 and the resistance element 170 effectively suppresses the reflected noise, even with the high-speed clock branching into two and applied to the data input terminal 105 and the first differential clock terminal 160 as the output of the driver 100 in the LSI tester 500.

In this fashion, having the terminating resistor 150 and the resistance element 170, the DUT board 102F of the ninth preferred embodiment can apply a high-quality signal to the device 98 with high accuracy in timing.

10. Other Features

While the test signal, or the output of the driver 100, branches into the two signal propagation paths at the relay in the fifth to the ninth preferred embodiments, the relay may be substituted by a MOS transistor or a power splitter.

The use of the relay or the MOS transistor allows easy control of the selection of the signal transmission paths by the electric signal. On the other hand, the use of the power splitter allows impedance matching before and after the branch, thereby suppressing the occurrence of reflected noise of the signals applied to the data input terminal and the clock terminal. Further, the use of the MOS transistor allows a highspeed switch-over of the signal transmission paths.

Further, while the signal propagation delay time is determined by the axial cables in the fifth to the ninth preferred embodiments, the axial cable may be substituted by an active delay element capable of setting a delay time through a predetermined setting operation.

The delay time can be relatively easily varied by varying the lengths of the axial cables or through the predetermined setting operation by the active delay element. Further, the length of the axial cables may be determined with consideration for device characteristics, such as delays in a jitter, an internal clock, and so on.

While the invention has been described in detail, the foregoing description is in all aspects illustrative and not restrictive. It is understood that numerous other modifications and variations can be devised without departing from the scope of the invention.

We claim:

1. A test system, comprising:

a semiconductor device to be tested, said semiconductor device including at least first and second input terminals and an input/output buffer cell for buffering a signal obtained from said first input terminal to output an internal signal, the operation of said semiconductor device controlled by a signal obtained from said second input terminal;

first delay means for delaying a signal to be transmitted therethrough for a first signal propagation delay time;

second delay means for delaying a signal to be transmitted therethrough for a second signal propagation delay time different from said first signal propagation delay time; and signal-transmission-path forming means for receiving a first test signal and forming a first signal transmission path along which said first test signal is transmitted through said first delay means to said first input terminal of said semiconductor device, and a second transmission path along which said first test signal is transmitted through said second delay means to said second input terminal of said semiconductor device.

2. The test system according to claim 1, wherein said second signal propagation delay time is set longer than said first signal propagation delay time; and further comprising:

third delay means for delaying a signal to be transmitted therethrough for a third signal propagation delay time; and fourth delay means for delaying a signal to be transmitted therethrough for a fourth signal propagation delay time shorter than said third signal propagation delay time, said signal-transmission path forming means forming said first and second signal transmission paths in a first test mode; and in a second test mode, said signal-transmission-path forming means further receiving a second test signal and forming a third signal transmission path along which said second test signal is transmitted through said third delay means to said first input terminal of said semiconductor device, and a fourth signal transmission path along which said second test signal is transmitted through said fourth delay means to said second input terminal of said semiconductor device.

3. The test system according to claim 1, wherein said semiconductor device further includes an output terminal capable of outputting a signal obtained from said first input terminal at a setting of a predetermined condition, without logically processing said signal, and further comprisining:

third delay means for delaying a signal to be transmitted therethrough for a third signal propagation delay time;

fourth delay means for delaying a signal to be transmitted therethrough for a fourth signal pr opagation delay time equal to said third signal propagation delay time; and tolerable-output-time delay means for delaying a signal to be transmitted therethrough for a predetermnined tolerable output time, said signal-transmission-path forming means further receiving a second test signal, in a first mode for testing an output time, said signal-transmission-path forming means forming a first signal transmission path for testing an output time, capable of outputting a signal obtained by transmitting said second test signal through said fourth delay means and said tolerable-output-time delay means, to the outside as a first comparison signal, in a second mode for testing an output time, said signal-transmission-path forming means forming second and third signal propagation paths for testing an output time, along which said first and said second test signals are transmitted through said third and said fourth delay means to said first and said second input terminals, respectively, and a fourth signal transmission path for testing an output time, capable of outputting a signal obtained from said output terminal to the outside as a second comparison signal.

4. The test board according to claim 1, wherein said signal-propagation-path forming means, in said first test mode, terminates said first and said second input terminals via first and second terminating resistors, respectively.

5. The test board according to claim 1, wherein said second input terminal includes first and second differential input terminals;

the operation of said semiconductor device is controlled by a signal obtained from said first and said second differential input terminals; and said signal-transmission-path forming means, in said first test mode, applies said first test signal through said second delay means to said first differential input terminal of said second input terminal of said semiconductor device, and applies a fixed voltage to said second differential input terminal.

6. The test board according to claim 5, wherein said signal-transmission-path forming means, in said first test mode, terminates said first input terminal via a first terminating resistor, and connects said first and said second differential input terminals with a resistance element.

7. The test system according to claim 1, wherein said first and said second signal transmission paths are formed in such a manner that a transmission path of said first test signal branches into two with a magnetic relay, an MOS transistor, or a power splitter.

8. The test system according to claim 1, wherein said first and said second delay means are formed of an axial cable determining a delay time according to its length, or an active delay element capable of setting a delay time through a predetermined setting operation.

* * * * *

UNITED STATES PATENT AND TRADEMARK OFFICE
CERTIFICATE OF CORRECTION

PATENT NO.    : 6,356,096 B2                                      Page 1 of 1
DATED         : March 12, 2002
INVENTOR(S)   : Takagi et al.

It is certified that error appears in the above-identified patent and that said Letters Patent is hereby corrected as shown below:

<u>Title page,</u>
The CPA information has been omitted. It should read as follows:
-- [45] **Date of Patent:  \*Mar. 12, 2002** --
-- [\*] Notice:  This patent issued on a continued prosecution
                 application filed under 37 CFR 1.53(d), and is
                 subject to the twenty year patent term provisions
                 of 35 U.S.C 154(a)(2). --

Signed and Sealed this

Seventeenth Day of September, 2002

Attest:

JAMES E. ROGAN
*Attesting Officer*    *Director of the United States Patent and Trademark Office*